(12) United States Patent
Tam

(10) Patent No.: US 8,913,180 B2
(45) Date of Patent: Dec. 16, 2014

(54) FOLDED TAPE PACKAGE FOR ELECTRONIC DEVICES

(75) Inventor: Samuel Tam, Daly City, CA (US)

(73) Assignee: Flextronics AP, LLC, Broomfield, CO (US)

( * ) Notice: Subject to any disclaimer, the term of this patent is extended or adjusted under 35 U.S.C. 154(b) by 255 days.

(21) Appl. No.: 13/248,593

(22) Filed: Sep. 29, 2011

(65) Prior Publication Data

US 2013/0083239 A1     Apr. 4, 2013

(51) Int. Cl.
| | |
|---|---|
| H04N 5/225 | (2006.01) |
| H01L 23/48 | (2006.01) |
| H01L 23/00 | (2006.01) |
| H01L 27/146 | (2006.01) |
| H01L 23/498 | (2006.01) |

(52) U.S. Cl.
CPC .......... *H01L 27/14618* (2013.01); *H01L 24/97* (2013.01); *H01L 23/4985* (2013.01); *H01L 2224/45144* (2013.01); *H01L 2224/49175* (2013.01); *H01L 2924/0002* (2013.01)
USPC ............................ 348/374; 257/778; 257/780

(58) Field of Classification Search
CPC ...... H04N 5/2251–5/2254; H01L 2224/73211; H01L 2224/32145–2224/32146; H01L 2224/48274; H01L 2224/811
USPC ............................ 348/374; 257/777, 778, 780
See application file for complete search history.

(56) References Cited

U.S. PATENT DOCUMENTS

| | | | |
|---|---|---|---|
| 5,506,401 A * | 4/1996 | Segawa et al. ............. 250/208.1 |
| 6,384,472 B1 | 5/2002 | Huang | |
| 6,768,516 B2 * | 7/2004 | Yamada et al. ............... 348/340 |
| 7,246,431 B2 * | 7/2007 | Bang et al. ...................... 29/835 |
| 2002/0167081 A1 | 11/2002 | Kondo | |
| 2009/0034962 A1 * | 2/2009 | Mitani ......................... 396/535 |
| 2009/0232336 A1 * | 9/2009 | Pahl .............................. 381/175 |
| 2009/0277951 A1 * | 11/2009 | Ebihara et al. ............. 228/110.1 |
| 2010/0134985 A1 | 6/2010 | Hsu | |
| 2010/0226633 A1 | 9/2010 | Shiung et al. | |
| 2011/0102667 A1 | 5/2011 | Chua et al. | |

FOREIGN PATENT DOCUMENTS

| | | |
|---|---|---|
| EP | 2 437 296 | 4/2012 |
| WO | 2004/023546 | 3/2004 |
| WO | 2010/137396 | 12/2010 |

OTHER PUBLICATIONS

Office Action from European Patent Application No. 12 186 417.7 dated Nov. 29, 2013, 7 pages.

* cited by examiner

*Primary Examiner* — Sinh Tran
*Assistant Examiner* — Mark Monk
(74) *Attorney, Agent, or Firm* — Volpe and Koenig, P.C.

(57) ABSTRACT

Described herein is a folded tape package for electronic devices. The folded tape package uses a flexible tape substrate having two end sections for passive components and a middle section for connecting and stacking multiple dies. The stacked dies are encapsulated or covered with a mold. One side may be left exposed for device functionality and operation with additional components or devices. The passive components may also be covered with a mold. The end sections are folded such that the end sections are in a parallel configuration with the middle section. The flexible tape substrate may be a high density interconnect flexible tape substrate with two layers. A silicon substrate may be used to interconnect a die stack to the flexible tape substrate. The folded tape package has a reduced device footprint, lower substrate warpage effects, and higher substrate yields.

9 Claims, 34 Drawing Sheets

1300

1200

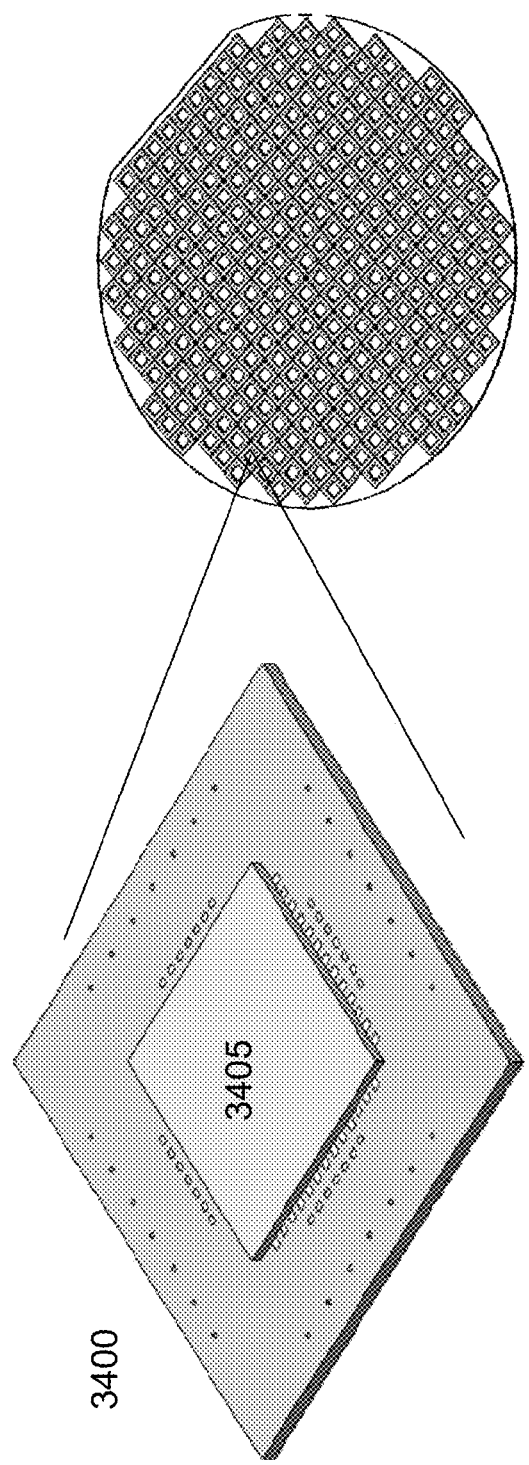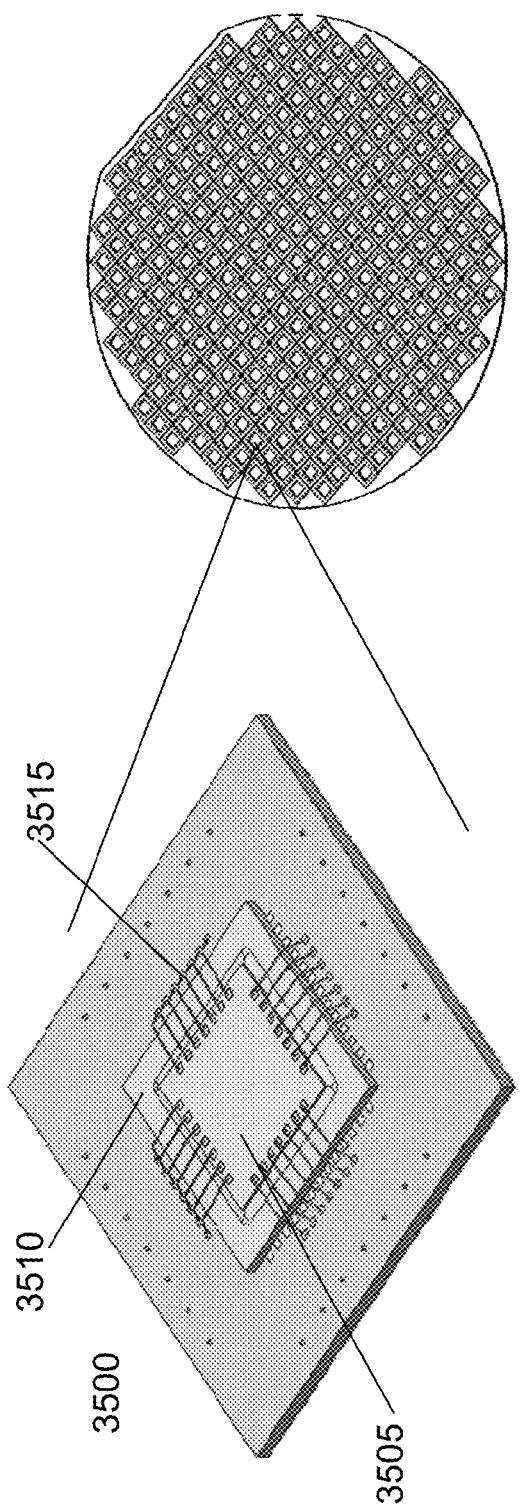
Figure 34
Figure 35

FOLDED TAPE PACKAGE FOR ELECTRONIC DEVICES

FIELD OF INVENTION

This application is related to packaging of electronic devices.

BACKGROUND

The desire for smaller, compact, cheaper and feature rich electronic devices, such as digital cameras, digital video cameras, phones, music players and the like, drives and forces minimization and efficient use of circuit boards.

SUMMARY

Described herein is a folded tape package for electronic devices. The folded tape package uses a flexible tape substrate having two end sections for passive components and a middle section for connecting and stacking multiple dies. The stacked dies are encapsulated or covered with a mold. One side may be left exposed for device functionality and operation with additional components or devices. The passive components may also be covered with a mold. The end sections are folded such that the end sections are in a parallel configuration with the middle section. The flexible tape substrate may be a high density interconnect (HDI) flexible tape substrate. The HDI flexible tape substrate may have two layers. A silicon substrate may be used to interconnect a die stack to the flexible tape substrate. The folded tape package has a reduced device footprint, lower substrate warpage effects, and higher substrate yields.

BRIEF DESCRIPTION OF THE DRAWINGS

FIG. 34 is an embodiment and example process flow for die bonding on a silicon wafer substrate;

FIG. 35 is an embodiment and example process flow for die stacking on a silicon wafer substrate;

DETAILED DESCRIPTION

Figure 1:
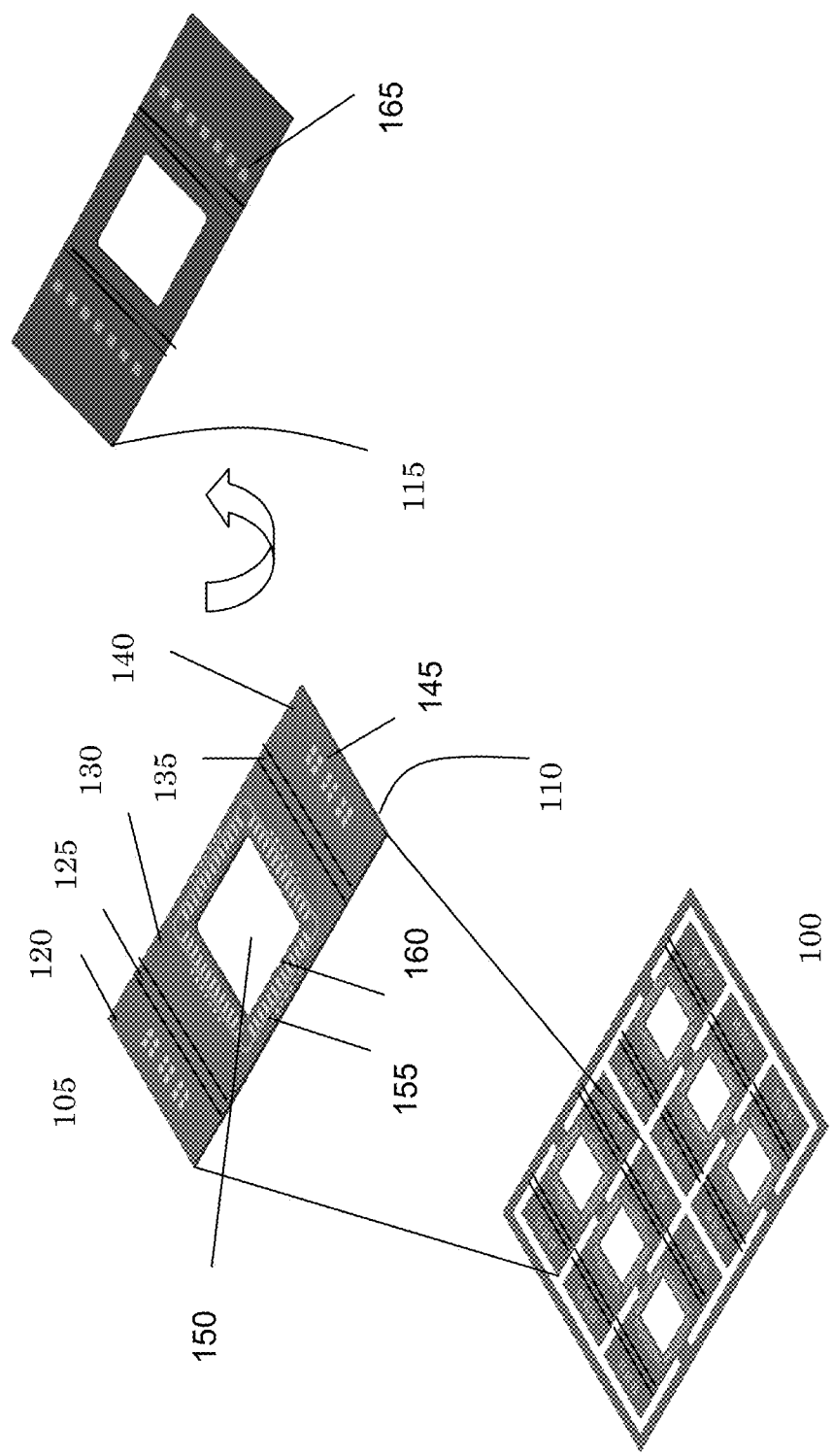
FIG. 1 is an embodiment and process view of a flexible tape substrate.

It is to be understood that the figures and descriptions of embodiments of the folded tape package have been simplified to illustrate elements that are relevant for a clear understanding, while eliminating, for the purpose of clarity, many other elements found in typical electronics packaging. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein.

Described herein is a folded tape package for electronic devices. The folded tape package uses a flexible tape substrate having two end sections for passive components and a middle section for connecting and stacking multiple dies. The stacked dies are encapsulated or covered with a mold. One side may be left exposed for device functionality and operation with additional components or devices. The passive components may also be covered with a mold. The end sections are folded toward the mold covered stacked die side such that the end sections are in a parallel configuration with the middle section. The flexible tape substrate may be a high density interconnect ((HDI) flexible tape substrate with two layers. The flexible tape substrate may be made of polyimide and other like materials. The folded tape package has a reduced device footprint, lower substrate warpage effects, and higher substrate yields. As described herein, the folded tape package eliminates the need of the through silicon vias (TSVs) for signal routing.

The non-limiting embodiments described herein are with respect to camera modules. Other electronic devices, modules and applications may also be used in view of these teachings without deviating from the spirit or scope as described herein. The folded tape package may be modified for a variety of applications and uses while remaining within the spirit and scope of the claims. The embodiments and variations described herein, and/or shown in the drawings, are presented by way of example only and are not limiting as to the scope and spirit. The descriptions herein may be applicable to all embodiments of the folded tape package although it may be described with respect to a particular embodiment.

FIGS. 1-14 show an embodiment and process flow for a folded tape package. FIG. 1 shows an embodiment of a flexible tape substrate strip 100 that may have multiple flexible tape substrate units 105. Each flexible tape substrate unit 105 may have a top surface 110 and a bottom surface 115. Each flexible tape substrate unit 105 may further have a first end section 120, a first fold section, 125, a middle section 130, a second fold section 135 and a second end section 140. The first end section 120 and the second end section 140 on the top surface 110 may have multiple surface mount (SMT) pads 145 for passive components, by way of non-limiting example. The middle section 130 on the top surface 110 may have a window cavity 150 for an imager chip or device, by way of non-limiting example. The window cavity 150 may have associated wire bonding pads 155 and flip chip pads 160. The first end section 120 and the second end section 140 on the bottom surface 110 may have a land grid array (LGA) 165, by way of non-limiting example.

The flexible tape substrate and flexible tape substrate strip 100 may be manufactured, implemented or constructed using techniques and processes known to those of skill in the art. The flexible tape substrate may be a high density interconnect (HDI) flexible tape substrate and the like. In the folded tape package embodiment described herein, the flexible tape substrate may be a two (2) layer flexible tape substrate as opposed to an eight (8) layer flexible tape substrate due to the folding configuration which increases As a result of using a 2 layer flexible tape substrate, warpage and thickness may controlled to within +/−15 µm as opposed to a 8 layer flexible tape substrate which may have a +/−60 µm variance. Moreover, reducing the thickness of the flexible tape substrate reduces the overall height of the electronic device, for example, a camera module.

For the embodiments described herein, the thin flexible tape substrate also permits the use of a single stud bump as opposed to a double stud bump, which may be needed for ceramic substrates. Ceramic substrates suffer from warpage and evenness issues and invariably need double stud bumps. The use of a single stud bump reduces costs as stud bumps are nominally made from gold wire. In some embodiments, stud bumping may not be needed due to the flatness of the substrates being used. In some embodiments, plated bumps may be used, which may reduce costs.

The flexible tape substrate may also permit the use of a gang press as substrate warpage is not an issue and may increase the units per hour. Moreover, die mounting for dummy tape units may not be needed to even out bonding force issues as the flexible tape substrate has minimal warpage issues and the level of bonding force may be reduced. In addition, the die may not have to be stud bumped, which in turn may reduce further costs. The use of the gang press may allow multiple tape substrate units to be bonded at the same time. Nominally, the bonding process may take 15 seconds per unit. In a gang press implementation for the flexible tape substrate, each unit may undergo a one (1) second pre-bond. This may be followed by a gang press bonding of 30 units, by way of non-limiting example, which may be for 16-17 seconds, by way of non-limiting example.

Figure 2:
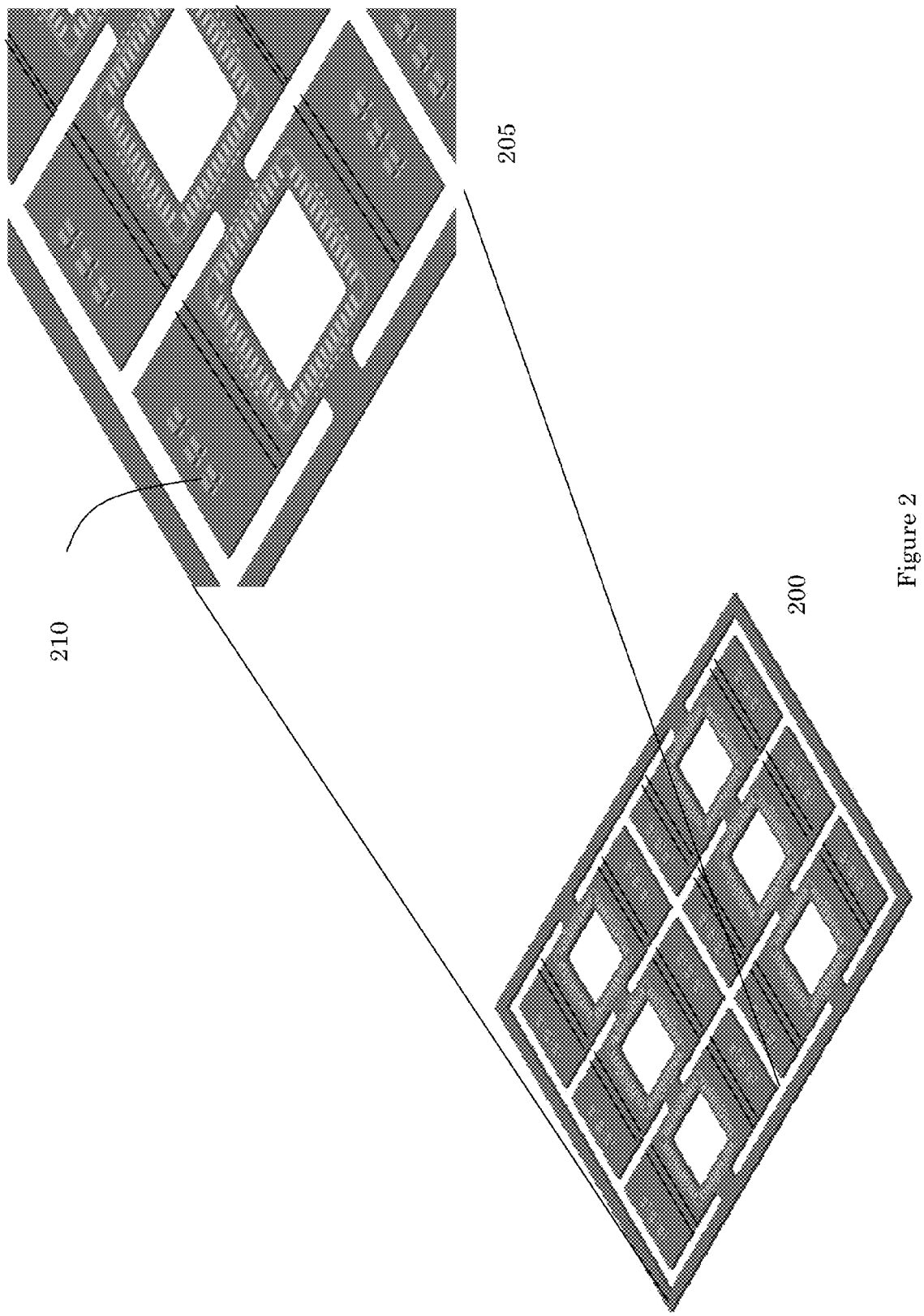
FIG. 2 is an embodiment of a flexible tape substrate with surface mounted passive components.

FIG. 2 shows a flexible tape substrate strip 200, where each flexible tape substrate unit 205 may have surface mounted passive components 210. The placement of the surface mounted passive components 210 may be accomplished using techniques and processes known to those of skill in the art. The placement of the surface mounted passive components may be done at the strip level to increase efficiencies and decrease costs. For example, by way of non-limiting example only, the units per hour may improved 30% or more by processing strips as opposed to ceramic coupon size.

Figure 3:
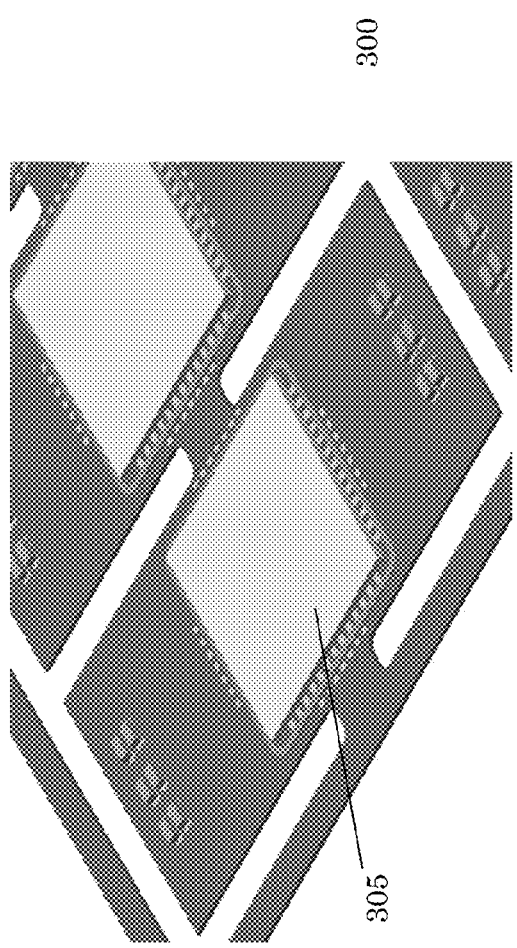
FIG. 3 is an embodiment of a flexible tape substrate with an attached die.

FIG. 3 shows a flexible tape substrate unit 300 including a die 305. The die 305, by way of non-limiting example only, may be an imager chip or some other electronic component. The die 305 is attached to the flexible tape substrate unit 300 using flip-chip bonding techniques and processes known to those of skill in the art. These may include, by way of non-limiting example only, thermo-compression or thermo-sonic flip chip bonding techniques. In the folded tape package embodiment described herein, the bonding force may reduce because bonding on the flexible tape surface may require less force than a ceramic substrate with single bump geometry. A thinner die may be used due to a better coefficient of thermal expansion match between the flexible tape substrate and the silicon die and reduced bonding force. The die attachment may be done at the strip level to increase efficiencies and decrease costs.

Figure 4:
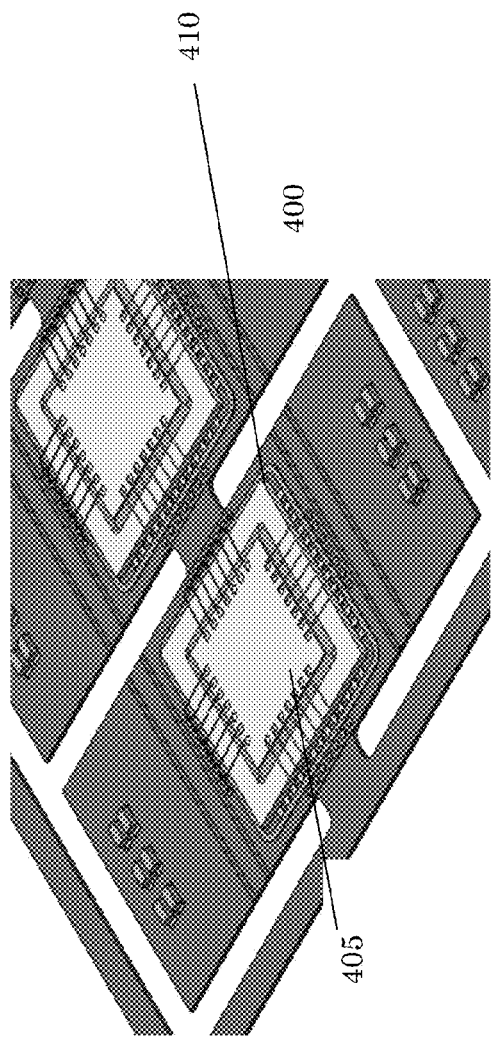
FIG. 4 is an embodiment of a flexible tape substrate having an attached die stack.

FIG. 4 shows a flexible tape substrate unit 400 having a second die 405 attached to the die 305 of FIG. 3 to form a die stack 410. The second die 405 may be a memory or processor die, by way of non-limiting example. The second die 405 may be implemented and attached to the flexible tape substrate unit 400 and die 305 using flip-chip bonding and wire bonding techniques and processes known to those of skill in the art. The die attachment may be done at the strip level to increase efficiencies and decrease costs.

Figure 5:
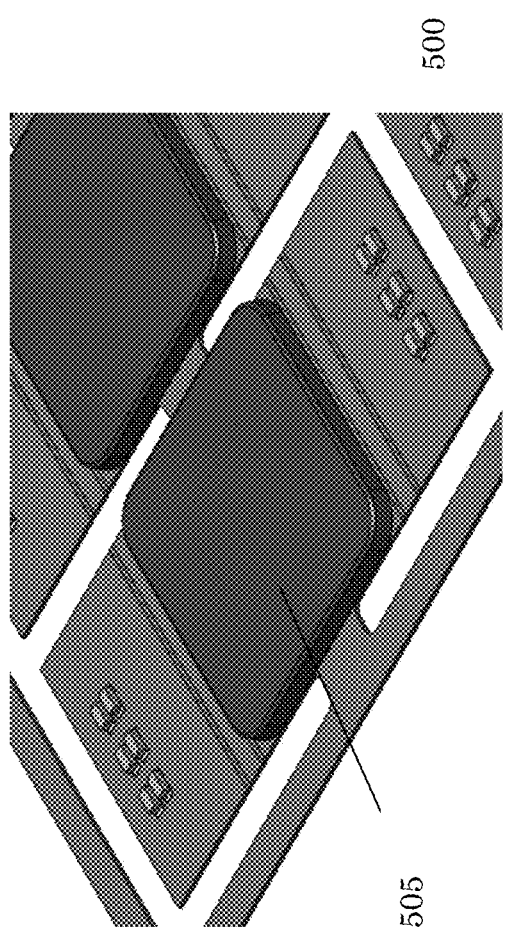
FIG. 5 is an embodiment of a flexible tape substrate having an attached die stack with a mold covering.

FIG. 5 shows a flexible tape substrate unit 500 having an attached die stack (not visible) that is covered with a mold 505. The mold 505 may be implemented using mold transfer techniques and processes known to those of skill in the art. The mold transfer may be done at the strip level to increase efficiencies and decrease costs. In addition to covering the die stack, a mold transfer process may be used to cover the SMTs which may provide much better reliability and handling. The temperature may be raised on the molded side for better temperature balance during bonding. Bonding time may then be reduced, which may increase or improve the units per hour (i.e., production).

Figure 6:
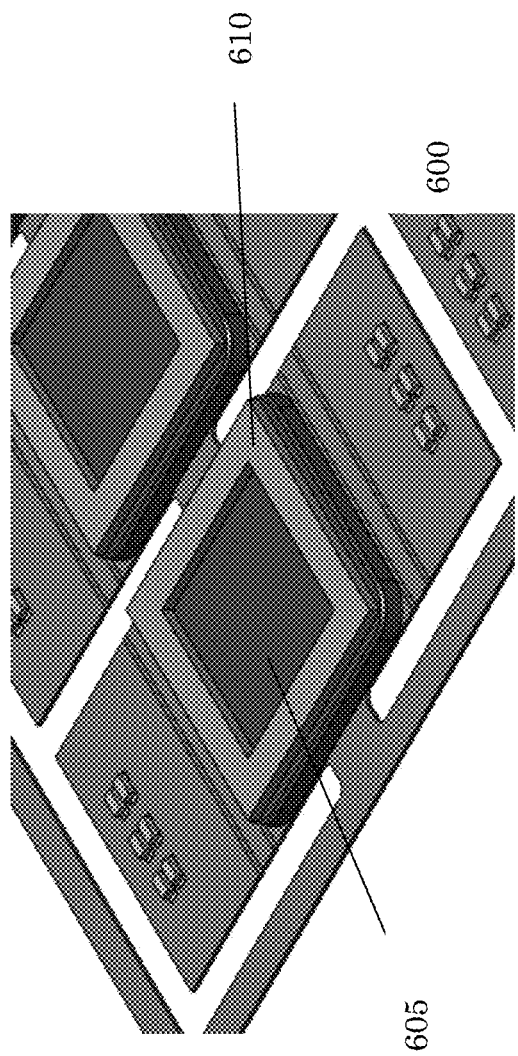
FIG. 6 is an embodiment of a flexible tape substrate having a stiffener attached to mold covered die stack.
Figure 7:
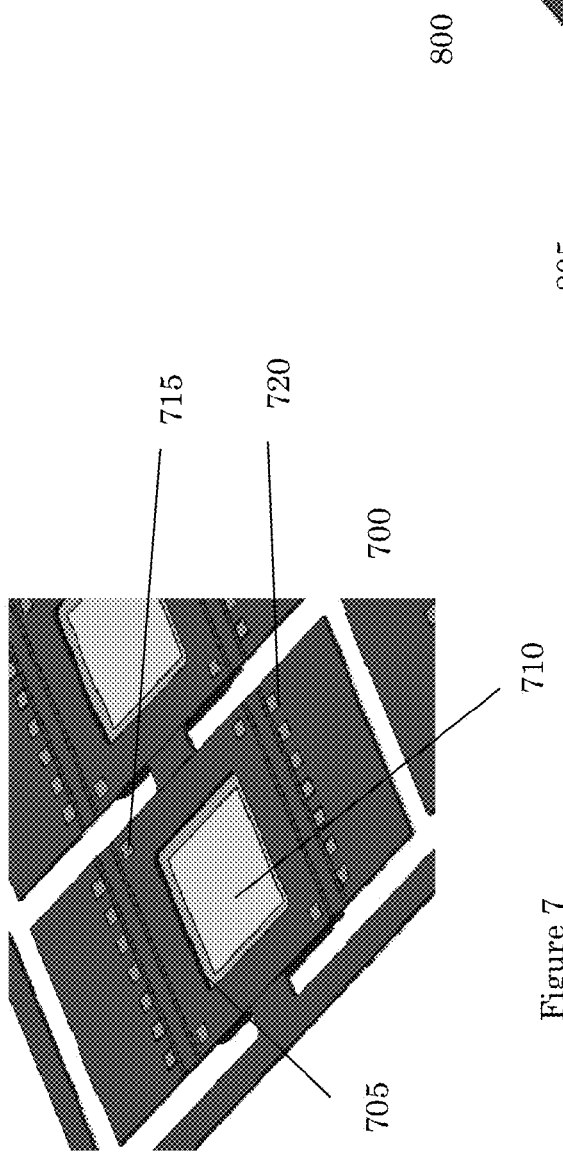
FIG. 7 is a bottom or reverse view of FIG. 6.

FIG. 6 shows a flexible tape substrate unit 600 that has a stiffener 610 attached to the mold covered die stack 605. The stiffener 610 attachment may be done at the strip level to increase efficiencies and decrease costs. FIG. 7 shows a bottom or reverse view 700 of the flexible tape substrate unit 600. For example, by way of non-limiting example, an image receiving face or side 710 of an imager chip 705 may be visible or exposed to an external light source. Also shown in FIG. 7 are contact pads 715 and land grid array (LGA) pads 720 for attachment and connection to other components.

Figure 8:
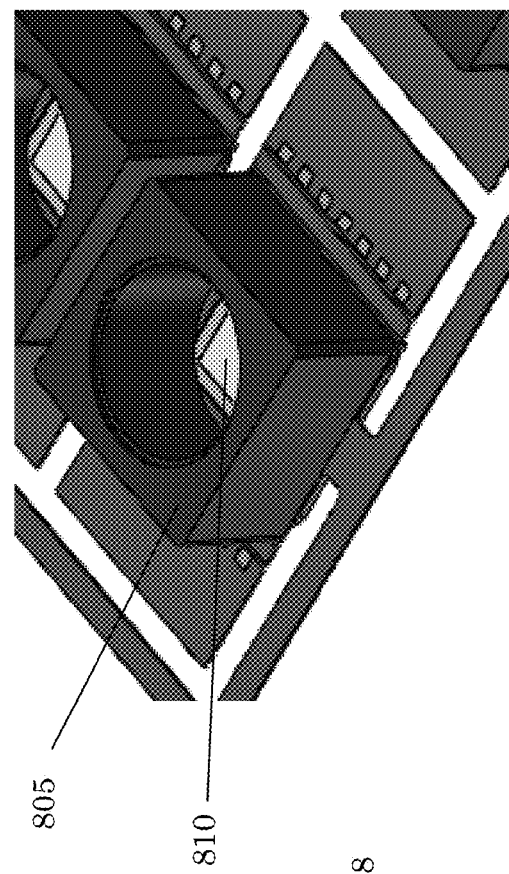
FIG. 8 is an embodiment of a flexible tape substrate having an attached housing.
Figure 9:
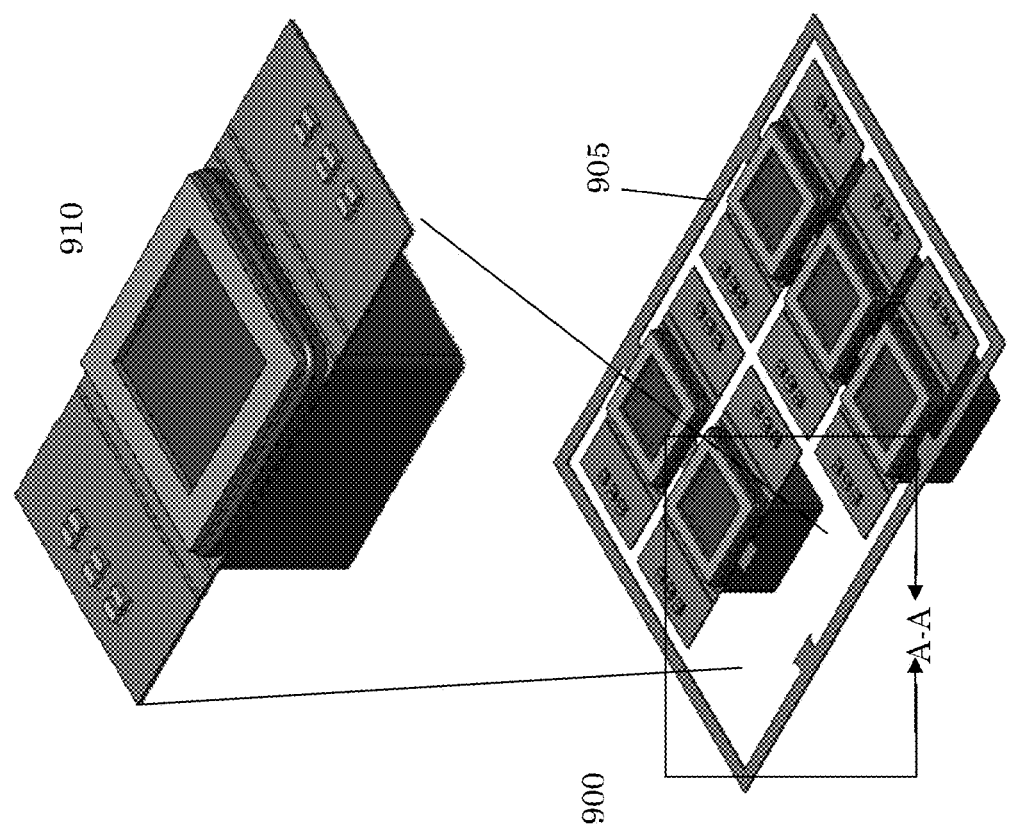
FIG. 9 is a view of a strip of the embodiment of FIG. 8.
Figure 10:
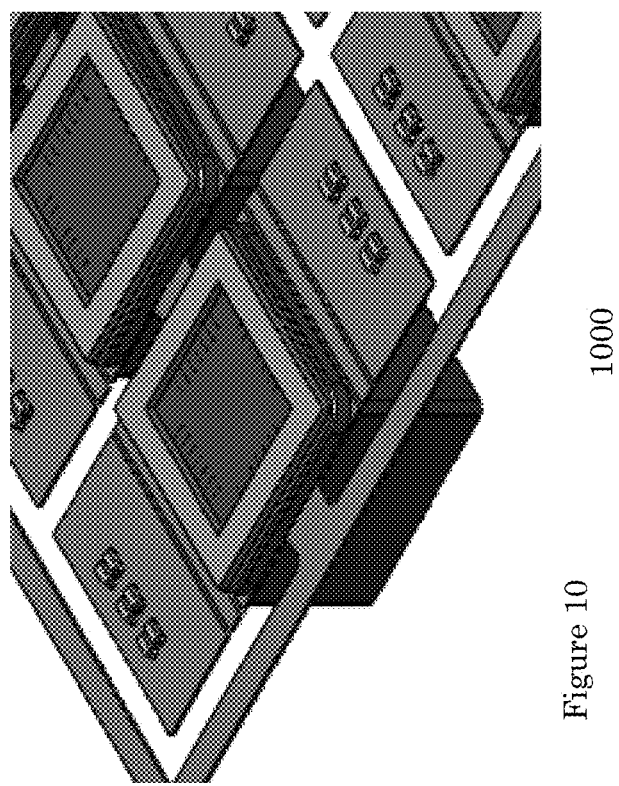
FIG. 10 is an exploded view of the strip of FIG. 9.

FIG. 8 shows a flexible tape substrate unit 800 having a housing 805, by non-limiting example, attached to a bottom or image receiving side 810. The housing 805 may be used to hold lenses in the case of a camera module, by way of non-limiting example. The housing 805 may be attached to contact pads, (not visible but shown in FIG. 7 as contact pads 715), using techniques and processes known to those of skill in the art. The housing attachment may be done at the strip level to increase efficiencies and decrease costs. FIG. 9 shows a top or non-image receiving side 905 of a flexible tape substrate strip 900 and a flexible tape substrate unit 910 of the embodiment shown in FIG. 8. FIG. 10 shows an exploded view 1000 taken along A-A of the flexible tape substrate strip 900 of FIG. 9. Punch singulation may be used to separate the flexible tape substrate unit 910 from the flexible tape substrate strip 900. Punching may be done with the flexible tape substrate as opposed to a snapping or dicing process. Punching is a simpler mechanism and may be used due to the thickness of the flexible tape substrate and strip construction.

Figure 11:
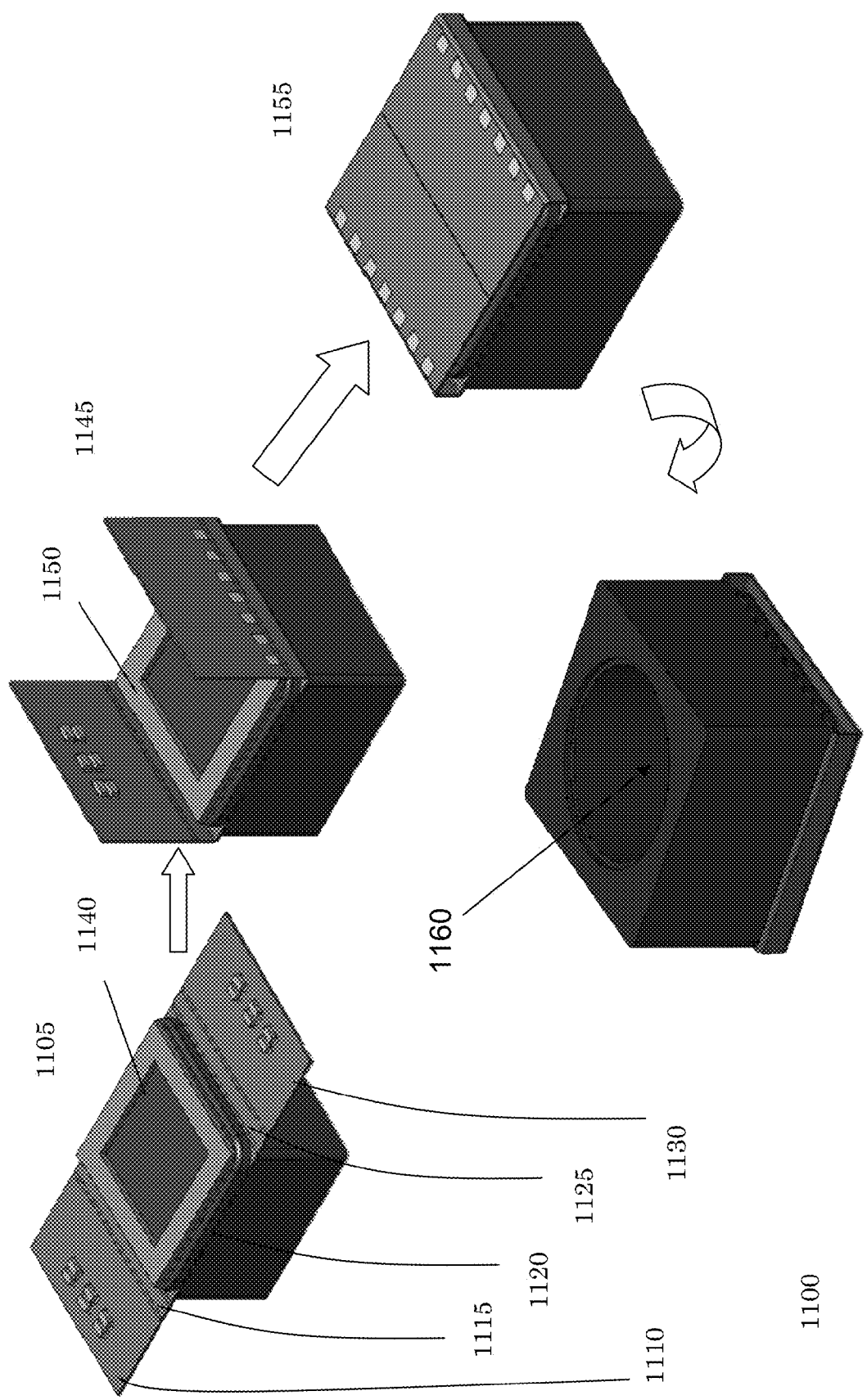
FIG. 11 is an embodiment and process view of folding the embodiment of FIG. 9.

FIG. 11 shows a folding process method 1100 for folding a flexible tape substrate unit 1105. As described herein, the flexible tape substrate unit 1105 may have a first end section 1110, a first fold section 1115, a middle section 1120, a second fold section 1125 and a second end section 1130. The first end section 1110 and the second end section 1130 are folded toward a top or non-image receiving side 1140 of the flexible tape substrate unit 1105 at a 90° angle (1145). The first end section 1110 and the second end section 1130 may then be folded toward each other and cover a stiffener 1150 to form a folded tape package 1155. A bottom or image receiving side 1160 of the folded tape package 1155 is also shown. As a result of the folded tape package 1155, more dies may be integrated since the flexible tape substrate is thinner and additional SMTs may be placed internal to the folded tape package 1155 on the first end section 1110 and the second end section 1130.

Figure 13:
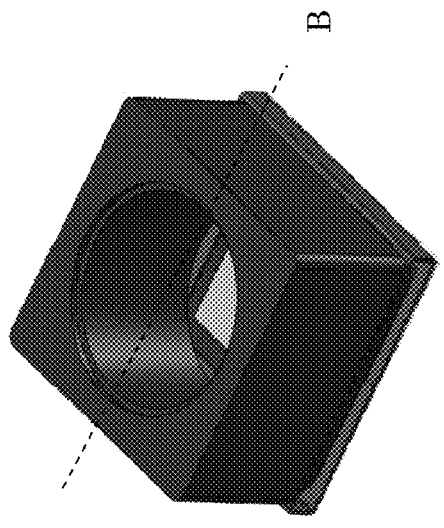
FIG. 13 is a reverse view of the embodiment of FIG. 11.
Figure 12:
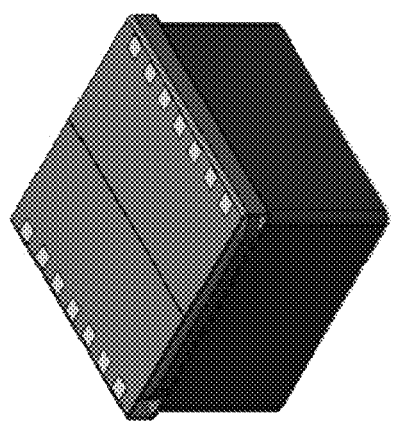
FIG. 12 is another view of the embodiment of FIG. 11.
Figure 14:
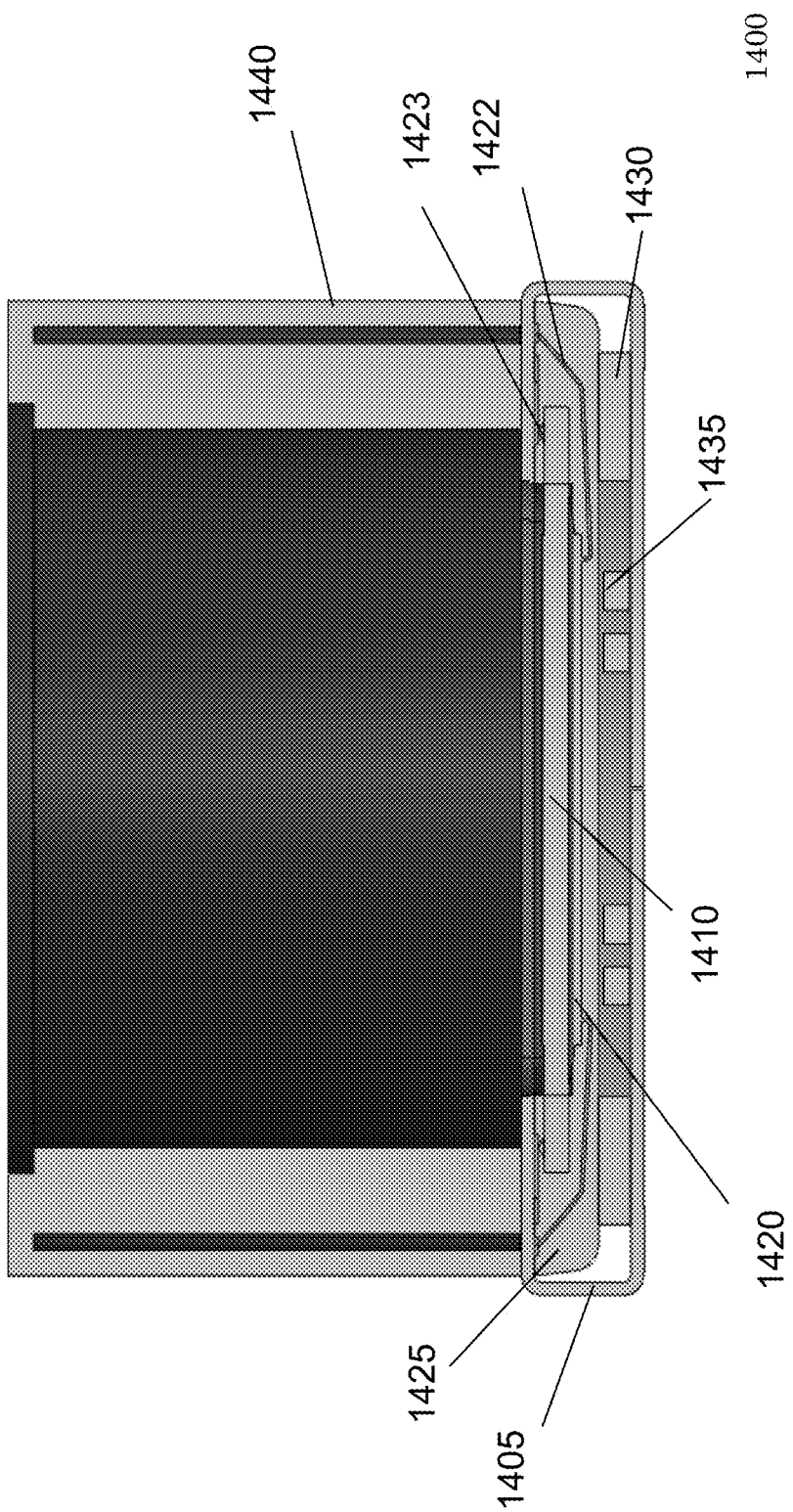
FIG. 14 is a cross-section of the embodiment of FIG. 13.

FIG. 12 shows a top or non-image receiving view of a folded tape package 1200 and FIG. 13 shows a bottom or image receiving side of a folded tape package 1300. FIG. 14 shows a cross-sectional view of a folded tape package 1400 of the folded tape package 1300 along line B-B of FIG. 13. As shown, an image sensor or imaging chip 1410 is interconnected to a folded tape substrate 1405. A processor and/or memory 1420 is interconnected using gold wire 1422 to the image sensor or imaging chip 1410. A mold 1425 covers the image sensor or imaging chip 1410 and the processor and/or memory 1420 (i.e., the die stack). A stiffener 1430 is attached to the mold 1425. SMTs 1435 are interconnected to the folded tape substrate 1405. A housing 1440 is situated on the bottom or image receiving side of the folded tape substrate 1405. As a result of the folded tape package 1400, more dies may be integrated since the flexible tape substrate is thinner and additional SMTs may be placed internal to the folded tape package 1400.

As shown in FIGS. 4, 7 and 11 and in particular, FIG. 14 and applicable to other embodiments described herein, the folded tape package provides signal routing without the use of through silicon vias (TSV), which may reduce complexity, processing time and costs. In particular, signal routing paths or connections between the processor and/or memory 1420 and image sensor or imaging chip 1410 (collectively a "die stack"), housing 1440, passive components 1435 and external devices or components may be implemented through the flip-chip connections 1423, wire bonding connections 1422, and contact pads (not visible but shown in FIG. 7 as contact pads 715) and LGA pads (shown in FIG. 7 as LGA pads 720).

Figure 15:
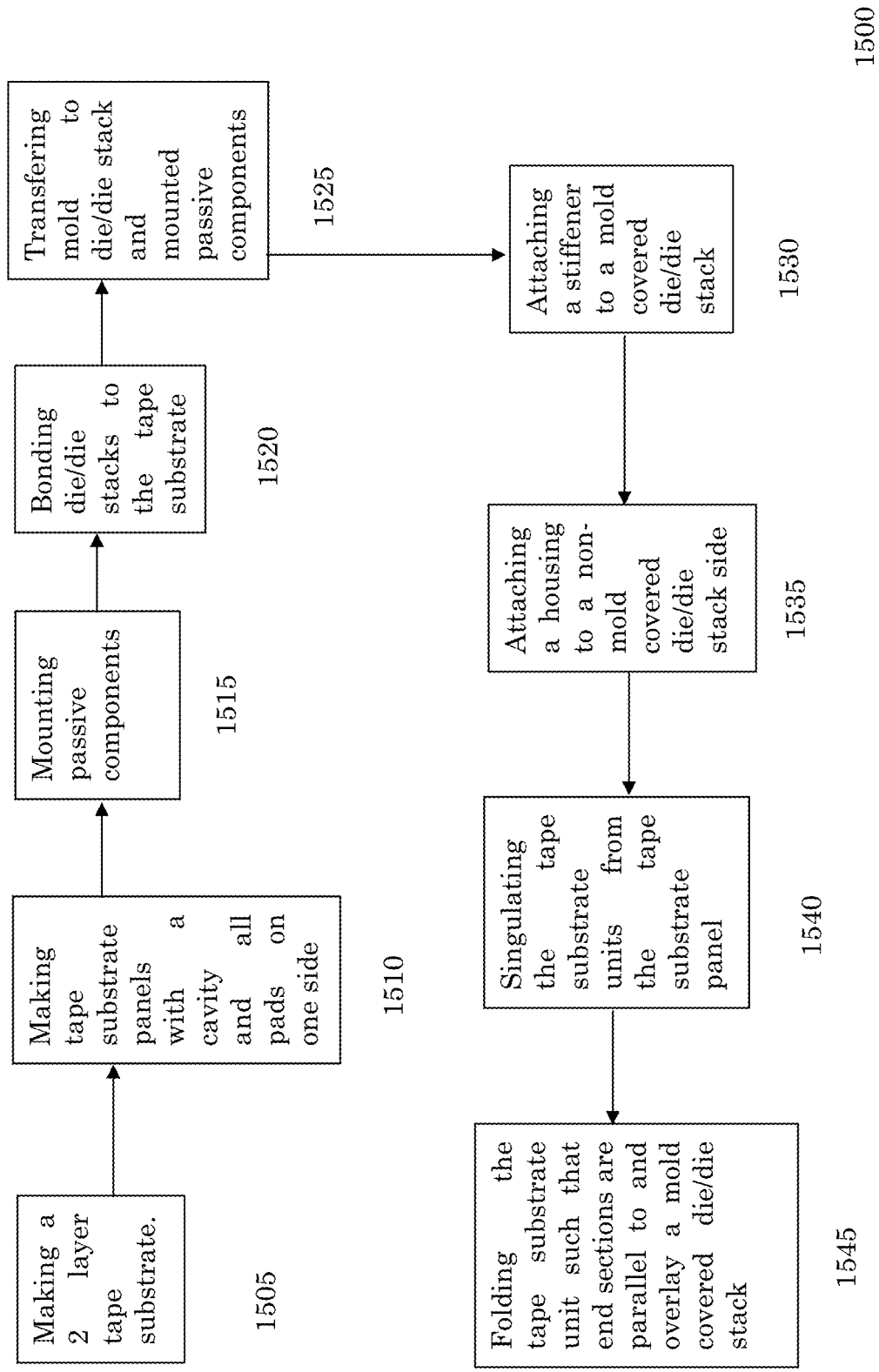
FIG. 15 is an example flowchart for manufacturing a folded tape package.

FIG. 15 is an example flowchart 1500 for manufacturing a folded tape package. For non-limiting purposes of further explanation, the folded tape package may be a camera module. A 2-layer flexible tape substrate is made using techniques and processes known to those of skill in the art (1505). Flexible tape substrate strips are made where a middle section has a cavity for placement of a die/die stack and two end sections that have SMT pads, flip-chip bond pads and wire bonding pads on one side of the flexible tape substrate strip and LGA pads on another side of the flexible tape substrate strip (1510). Passive components are mounted on the SMT pads (1515) and a die/die stack is bonded to the flexible tape substrate (1520). A transfer mold process in then applied to the die/die stack and may be applied to the mounted passive components (1525). A stiffener may be attached to the mold covered die/die stack (1530). A housing is attached to a non-mold covered die/die stack side (1535). The above may all be implemented in strip form. Each of the flexible tape substrate units are singulated from the flexible tape substrate strip (1540). The end sections of flexible tape substrate units are folded up toward a mold covered die/die stack side and then folded again toward each other such that the end sections are somewhat parallel to the middle section (1545), i.e., the end sections are somewhat parallel to and overlay a mold covered die/die stack. The fact that the end sections are described as being somewhat parallel is not to be construed in a limiting manner as they may be disposed as desired.

The methods described herein are not limited to any particular element(s) that perform(s) any particular function(s). Further, some steps of the methods presented need not necessarily occur in the order shown. For example, in some cases two or more method steps may occur in a different order or simultaneously. In addition, some steps of the described methods may be optional (even if not explicitly stated to be optional) and, therefore, may be omitted. These and other variations of the methods disclosed herein will be readily apparent, especially in view of the description of the folded tape package described herein, and are considered to be within the full scope of the invention.

Figure 16:
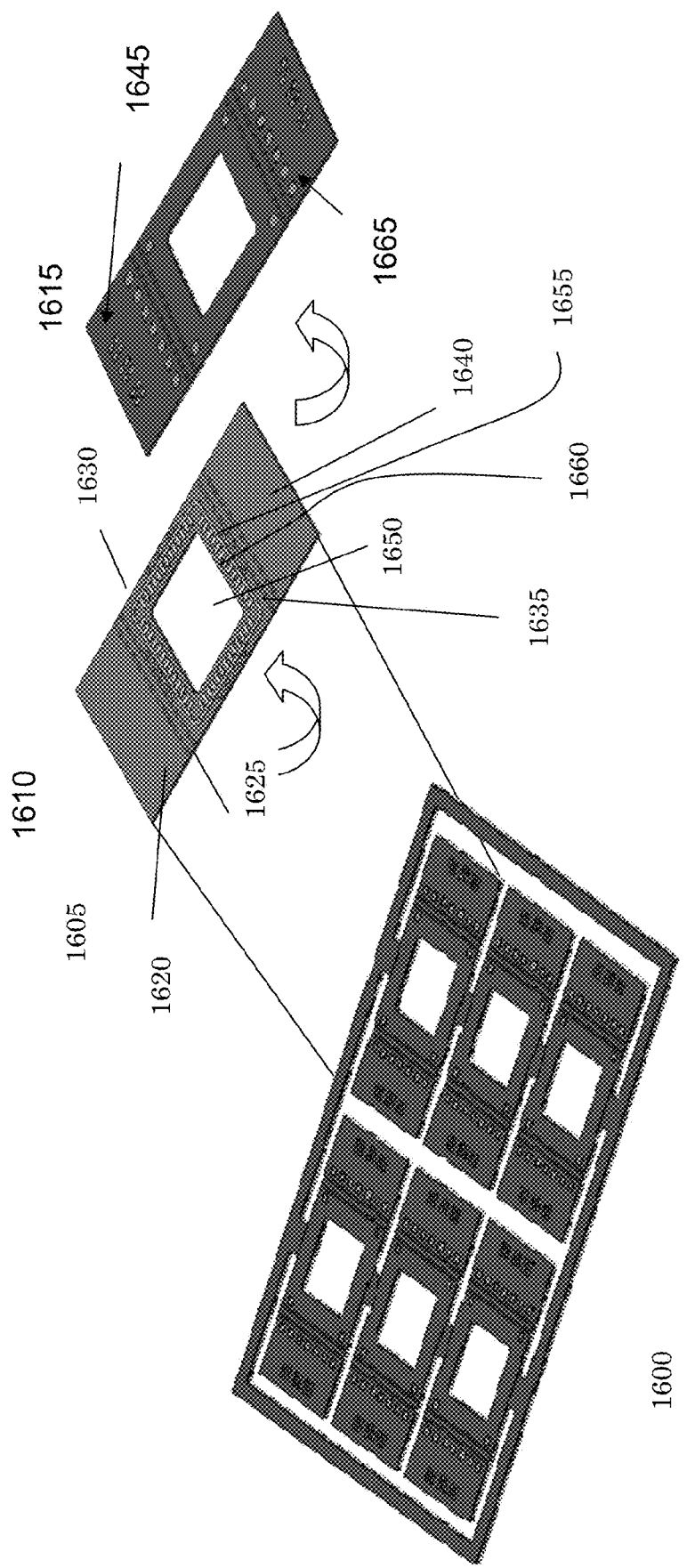
FIG. 16 is another embodiment and process view of a flexible tape substrate.

FIGS. 16-29 show another embodiment and process flow for a folded tape package. FIG. 16 shows an embodiment of a flexible tape substrate strip 1600 that may have multiple flexible tape substrate units 1605. Each flexible tape substrate unit 1605 may have a top surface 1610 and a bottom surface 1615. Each flexible tape substrate unit 1605 may further have a first end section 1620, a first fold section 1625, a middle section 1630, a second fold section 1635 and a second end section 1640. The first end section 1620 and the second end section 1640 on the bottom surface 1615 may have multiple surface mount (SMT) pads 1645 for passive components, by way of non-limiting example, and may have LGA pads 1665, by way of non-limiting example. The middle section 1630 on the top surface 1610 may have a window cavity 1650 for an imager chip or device, by way of non-limiting example. The window cavity 150 may have associated wire bonding pads 1655 and flip chip pads 1660.

As described herein, the flexible tape substrate and flexible tape substrate strip 1600 may be manufactured, implemented or constructed using techniques and processes known to those of skill in the art. The flexible tape substrate may be a high density interconnect (HDI) flexible tape substrate. As described herein, the flexible tape substrate may be a two (2) layer flexible substrate as opposed to an eight (8) layer tape substrate. As a result of using a 2-layer flexible tape substrate, warpage and thickness may controlled to within +/−15 μm as opposed to a 8 layer flexible tape substrate which may have a +/−60 μm variance. Moreover, reducing the thickness of the flexible tape substrate reduces the overall height of the electronic device, for example, a camera module.

Figure 17:
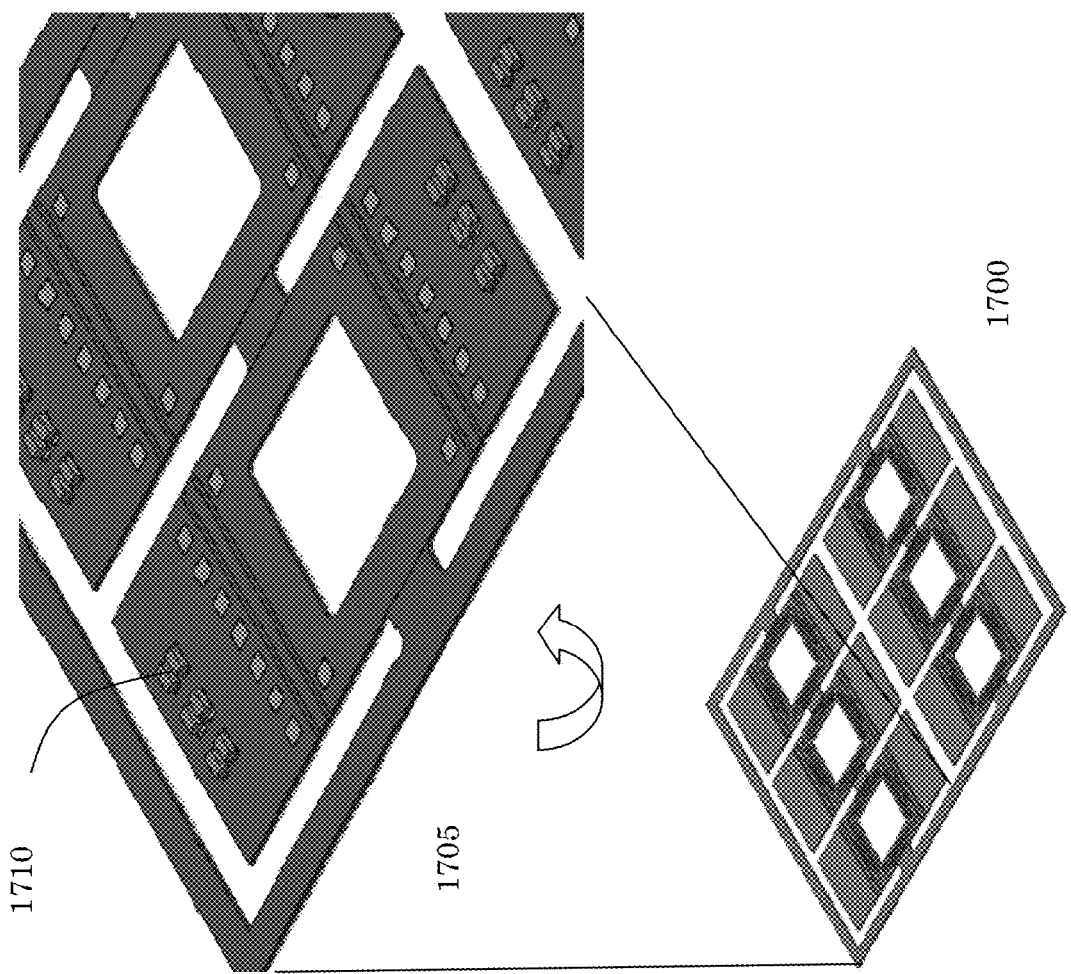
FIG. 17 is an embodiment of a flexible tape substrate with surface mounted passive components.

FIG. 17 shows a flexible tape substrate strip 1700, where each flexible tape substrate unit 1705 may have surface mounted passive components 1710. As described herein, the placement of the surface mounted passive components 1710 may be accomplished using techniques and processes known to those of skill in the art. The placement of the surface mounted passive components may be done at the strip level to increase efficiencies and decrease costs. For example, by way of non-limiting example only, the units per hour may improve by 30% or more by processing strips as opposed to a ceramic coupon size.

Figure 18:
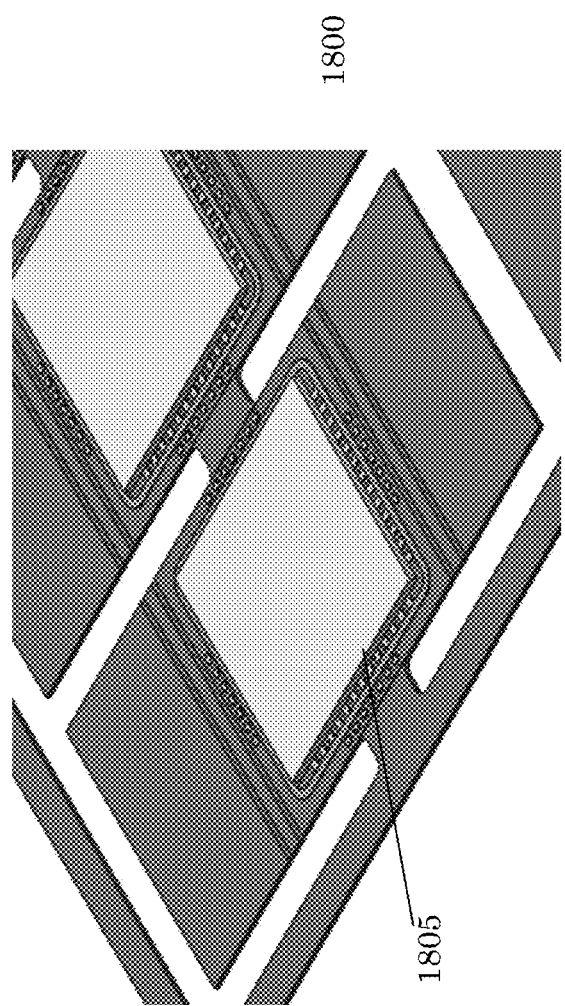
FIG. 18 is an embodiment of a flexible tape substrate having an attached die.

FIG. 18 shows a flexible tape substrate unit 1800 including a die 1805. The die 1805, by way of non-limiting example only, may be an imager chip or some other electronic component. As described herein, the die 1805 is attached to the flexible tape substrate unit 1800 using flip-chip bonding techniques and processes known to those of skill in the art. These may include, by way of non-limiting example only, thermo-compression or thermo-sonic flip chip bonding techniques. In the folded tape package embodiment described herein, the bonding force may reduce because bonding on the flexible tape surface may require less force than a ceramic substrate with single bump geometry. A thinner die may be used due to a better coefficient of thermal expansion match between the flexible tape substrate and the silicon die and reduced bonding force. The die attachment may be done at the strip level to increase efficiencies and decrease costs.

Figure 19:
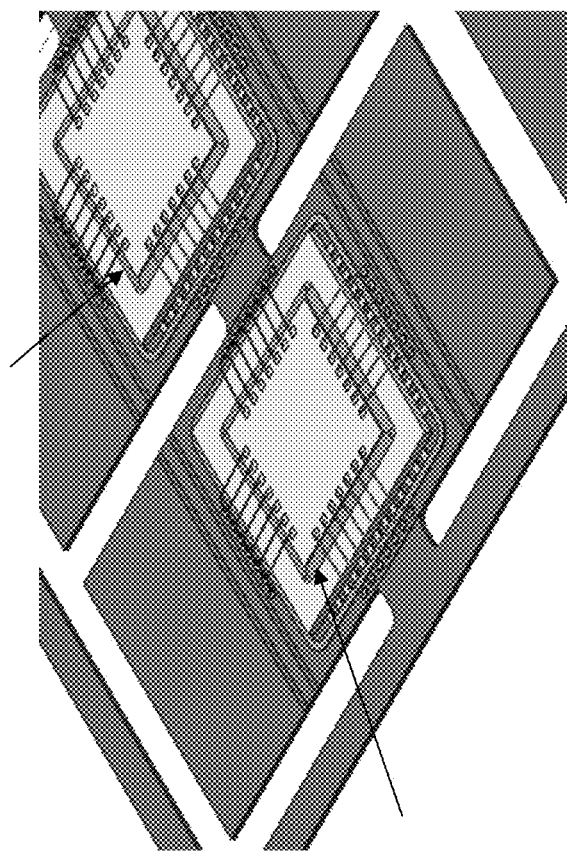
FIG. 19 is an embodiment of a flexible tape substrate having an attached die stack.

FIG. 19 shows a flexible tape substrate unit 1900 having a second die 1905 attached to the die 1805 of FIG. 8 to form a die stack 1910. The second die 1905 may be a memory or processor die, by way of non-limiting example. The second die 1905 may be implemented and attached to the flexible tape substrate unit 1900 and die 1805 using flip-chip bonding and wire bonding techniques and processes known to those of skill in the art. The die attachment may be done at the strip level to increase efficiencies and decrease costs.

Figure 20:
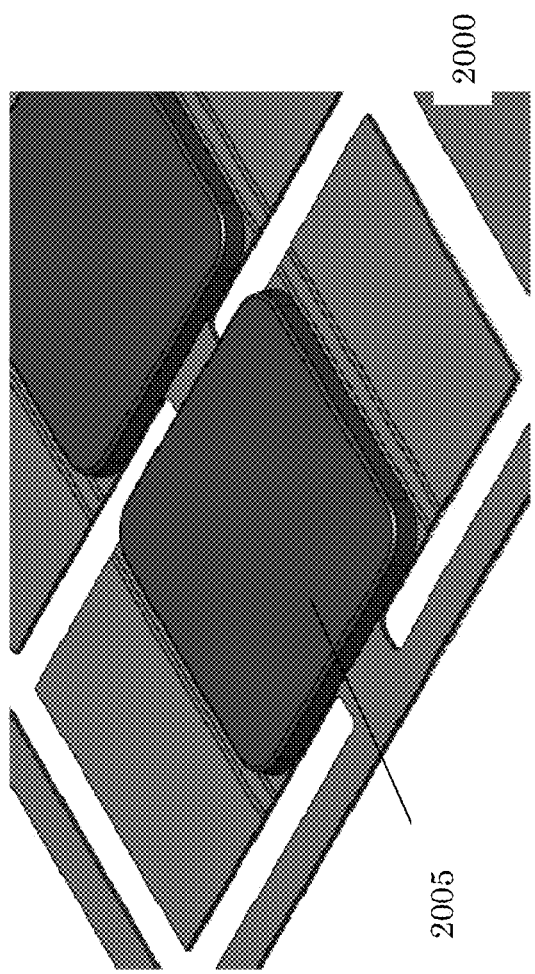
FIG. 20 is an embodiment of a flexible tape substrate having an attached die stack with a mold covering.

FIG. 20 shows a flexible tape substrate unit 2000 having an attached die stack (not visible) that is covered with a mold 2010. As described herein, the mold 2010 may be implemented using mold transfer techniques and processes known to those of skill in the art. The mold transfer may be done at the strip level to increase efficiencies and decrease costs. In addition to covering the die stack, a mold transfer process may be used to cover the SMTs which may provide much better reliability and handling. The temperature may be raised on the molded side for better temperature balance during bonding. Bonding time may then be reduced, which may increase or improve the units per hour (i.e., production).

Figure 21:
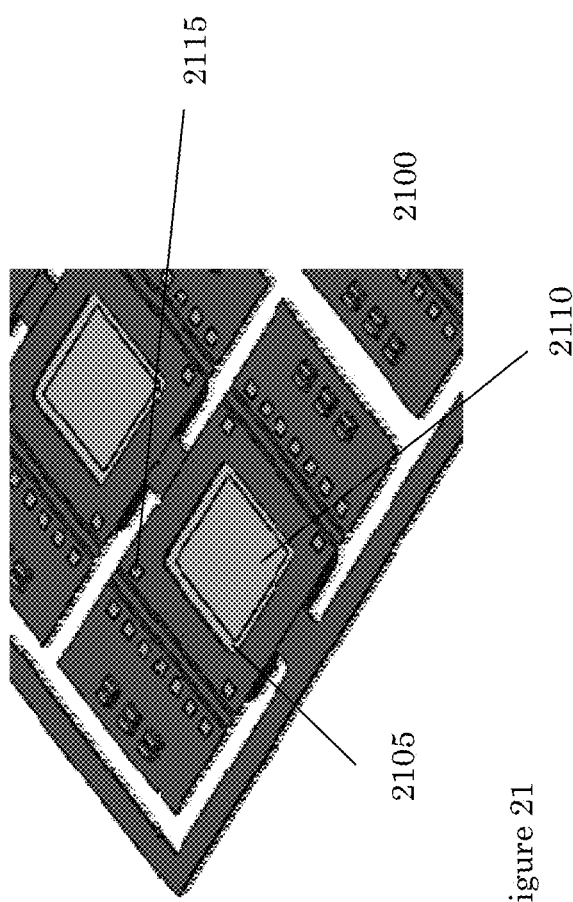
FIG. 21 is a reverse view of the embodiment of FIG. 20.

FIG. 21 shows a bottom or reverse view 2100 of the flexible tape substrate unit 2000. For example, by way of non-limiting example, an image receiving face or side 2110 of an imager chip 2105 may be visible or exposed to an external light source. Also shown in FIG. 21 are contact pads 2115 for attachment of other components.

Figure 22:
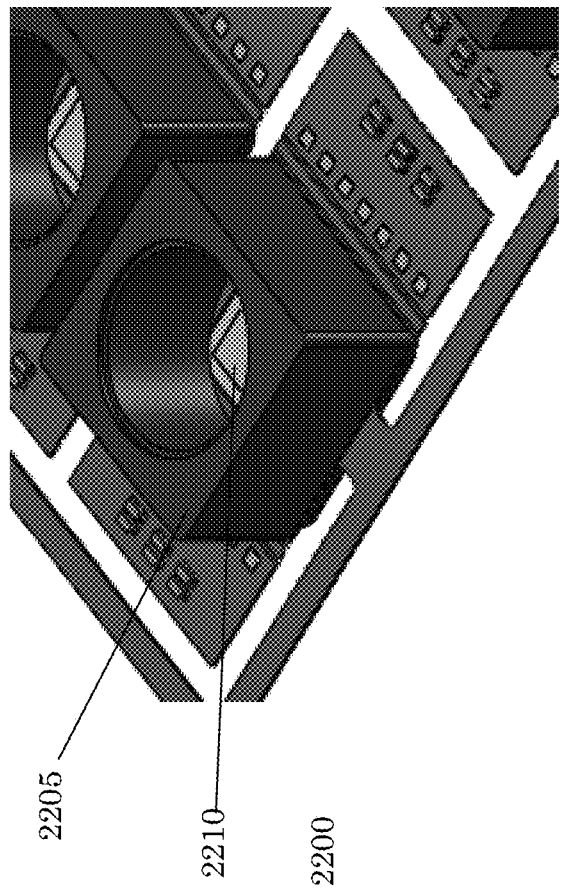
FIG. 22 is an embodiment of a flexible tape substrate having an attached housing.
Figure 23:
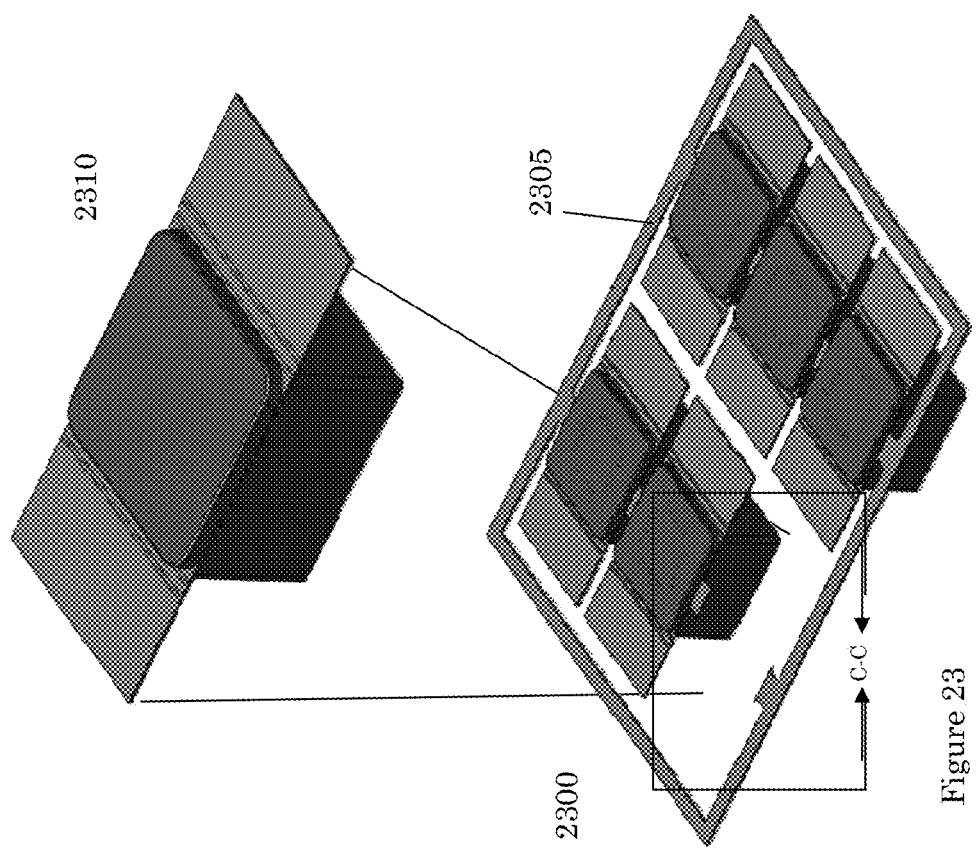
FIG. 23 is a view of a strip of the embodiment of FIG. 22.
Figure 24:
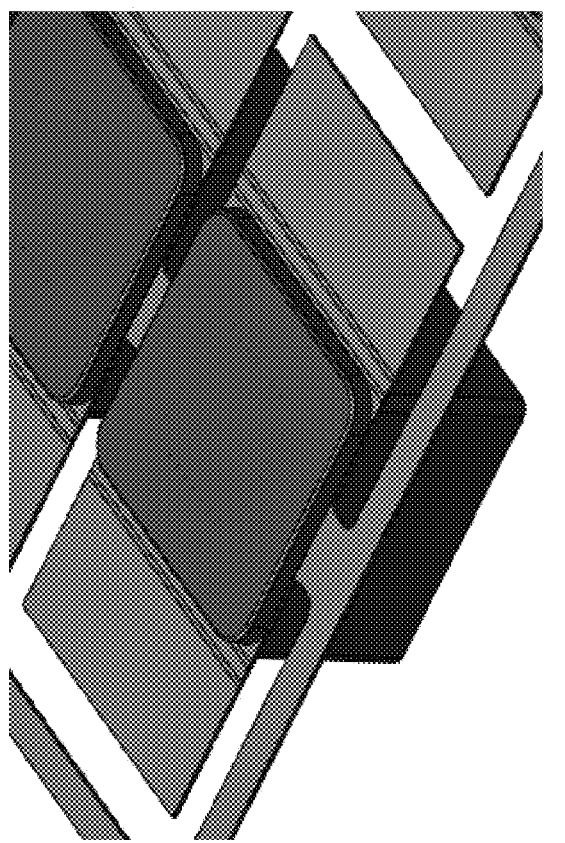
FIG. 24 is an exploded view of the strip of FIG. 23.

FIG. 22 shows a flexible tape substrate unit 2200 having a housing 2205, by non-limiting example, attached to a bottom or image receiving side 2210. The housing 2205 may be used to hold lenses in the case of a camera module, by way of non-limiting example. The housing 2205 may be attached to pads (not visible) using techniques and processes known to those of skill in the art. The housing attachment may be done at the strip level to increase efficiencies and decrease costs. FIG. 23 shows a top or non-image receiving side 2300 of a flexible tape substrate strip 2305 and a flexible tape substrate unit 2310 of the embodiment shown in FIG. 22. FIG. 24 shows an exploded view 2400 taken along C-C of the flexible tape substrate strip 2300 of FIG. 23. Punch singulation may be used to separate the flexible tape substrate unit 910 from the flexible tape substrate strip 900. Punching may be done with the flexible tape substrate as opposed to a snapping or dicing process. Punching is a simpler mechanism and may be used due to the thickness of the flexible tape substrate and strip construction.

Figure 25:
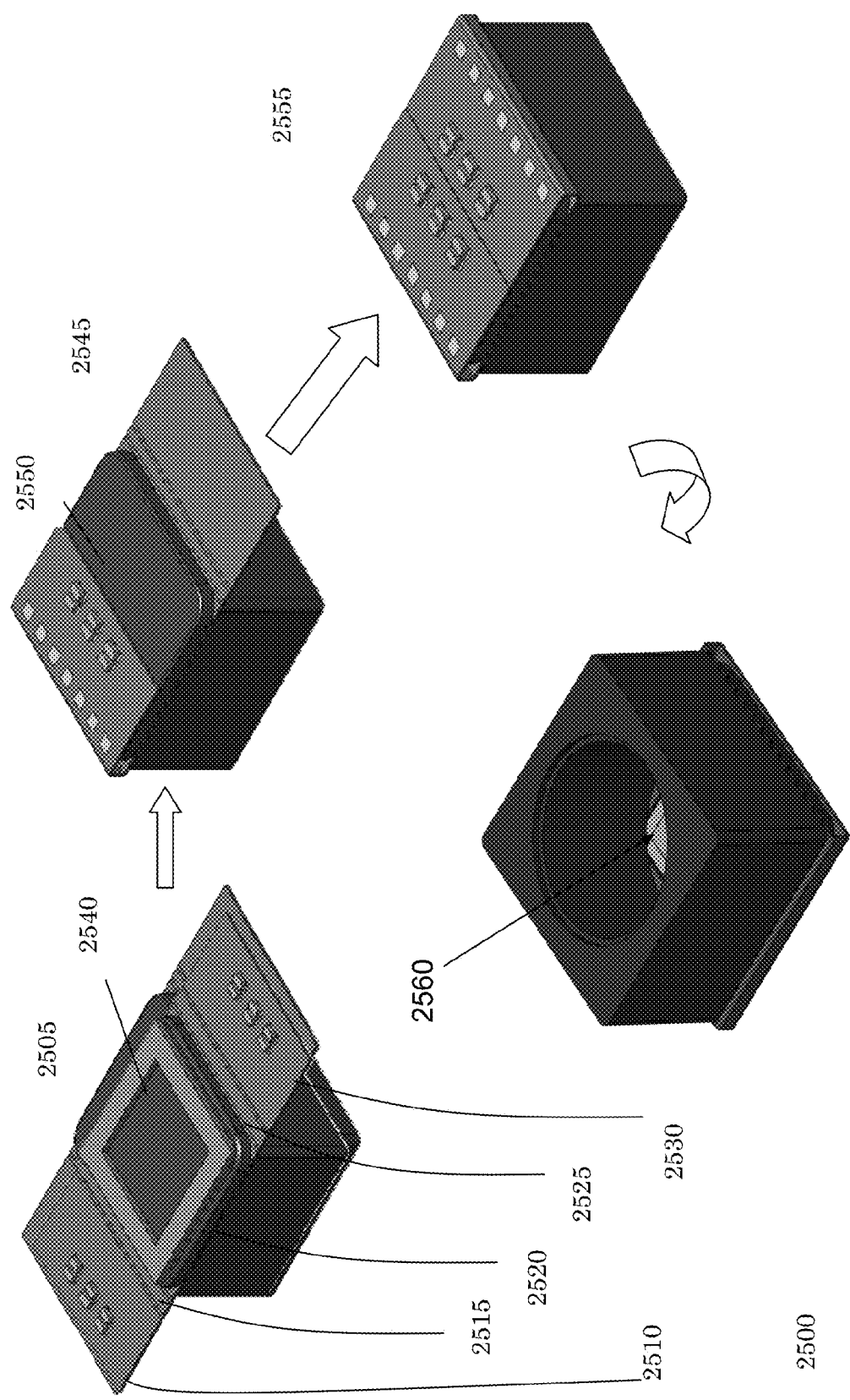
FIG. 25 is an embodiment and process view of folding the embodiment of FIG. 23.

FIG. 25 shows a folding process method 2500 for folding a flexible tape substrate unit 2505. As described herein, the flexible tape substrate unit 2505 may have a first end section 2510, a first fold section 2515, a middle section 2520, a second fold section 2525 and a second end section 2530. The first end section 2510 and the second end section 2530 are folded toward a top or non-image receiving side 2540 of the flexible tape substrate unit 2505 at a 90° angle (2545). The first end section 2510 and the second end section 2530 may then be folded toward each other and cover a stiffener 2550 to form a folded tape package 2555. A bottom or image receiving side 2560 of the folded tape package 2555 is also shown. As a result of the folded tape package 2555, more dies may be integrated since the flexible tape substrate is thinner and additional SMTs may be placed internal to the folded tape package 2555 on the first end section 2510 and the second end section 2530.

Figure 27:
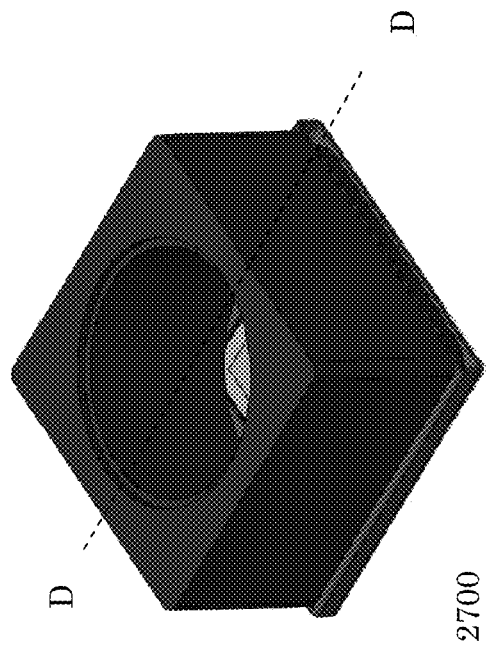
FIG. 27 is a reverse view of the embodiment of FIG. 25.
Figure 26:
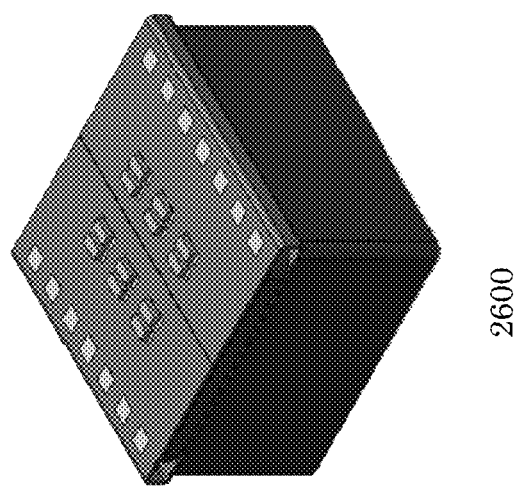
FIG. 26 is another view of the embodiment of FIG. 25.
Figure 28:
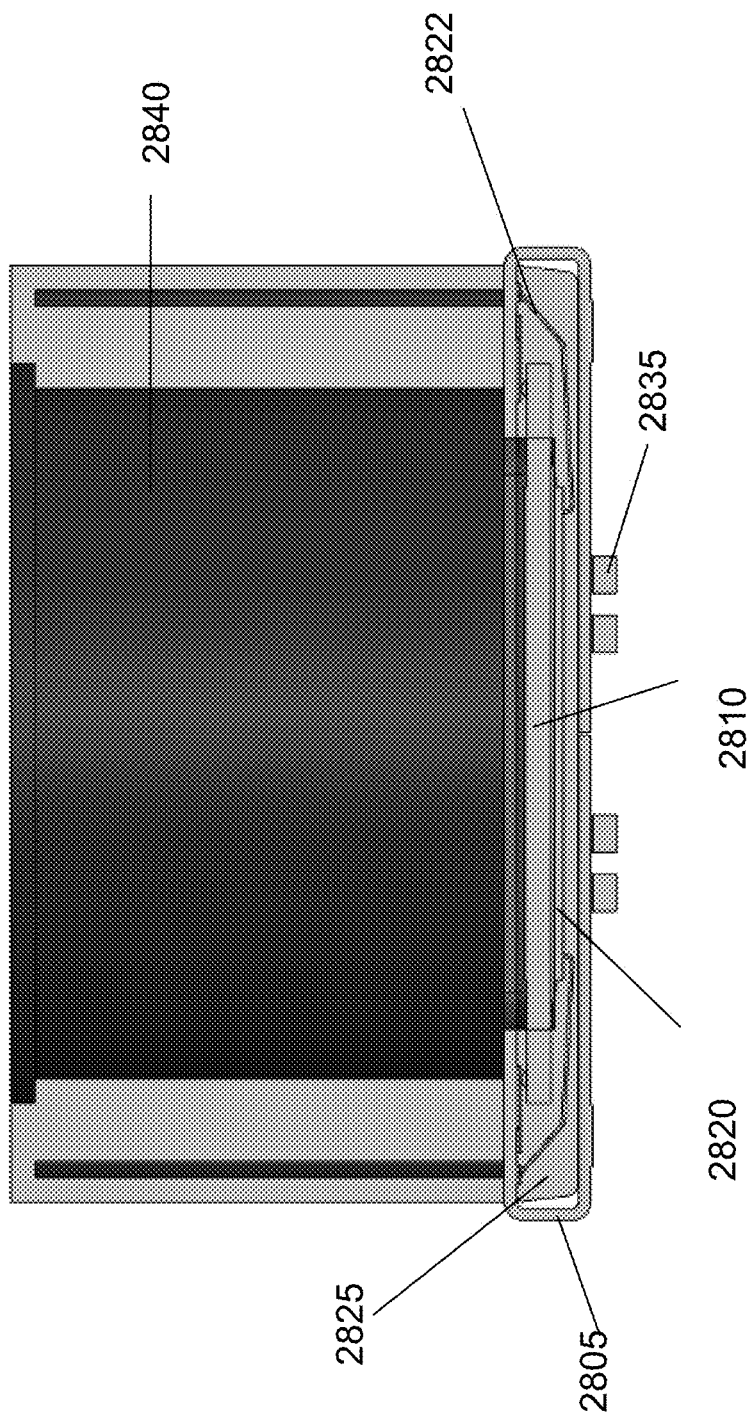
FIG. 28 is a cross-section of the embodiment of FIG. 27.

FIG. 26 shows a top or non-image receiving view of a folded tape package 2600 and FIG. 27 shows a bottom or image receiving side of a folded tape package 2700. FIG. 27 shows a cross-sectional view of a folded tape package 2800 of the folded tape package 2700 along line D-D of FIG. 27. As shown, an image sensor or imaging chip 2810 is interconnected to a folded tape substrate 2805. A processor and/or memory 2820 is interconnected using gold wire 2822 to the image sensor or imaging chip 2810. A mold 2825 covers the image sensor or imaging chip 2810 and the processor and/or memory 2820 (i.e., the die stack). SMTs 2835 are interconnected to the folded tape substrate 2805. A housing 2840 is situated on the bottom or image receiving side of the folded tape substrate 2805. As a result of the folded tape package 2800, more dies may be integrated since the flexible tape substrate is thinner and additional SMTs may be placed internal to the folded tape package 2800.

Figure 29:
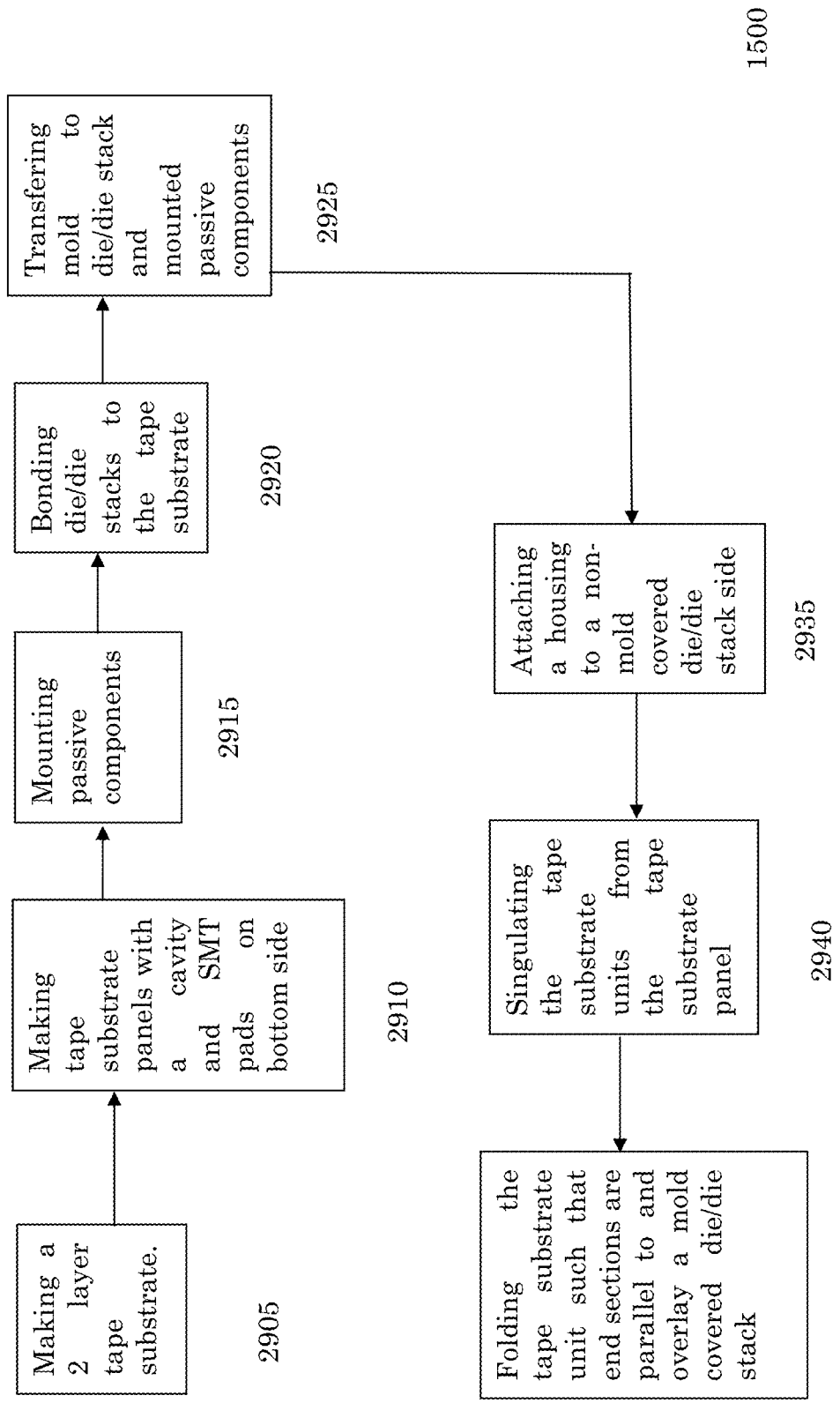
FIG. 29 is an example flowchart for manufacturing a folded tape package.

FIG. 29 is an example flowchart 2900 for manufacturing a folded tape package. For non-limiting purposes of further explanation, the folded tape package may be a camera module. A 2 layer flexible tape substrate is made using techniques and processes known to those of skill in the art (2905). Flexible tape substrate strips are made where a middle section has a cavity for placement of a die/die stack and two end sections that have, flip-chip bond pads and wire bonding pads on one side of the flexible tape substrate strip and SMT pads and LGA pads on other side of the flexible tape substrate strip (2910). Passive components are mounted on the SMT pads (2915) and a die or die stack is bonded to the flexible tape substrate (2920). A transfer mold process in then applied to the die or die stack and may be applied to the mounted passive components (2925). A housing is attached to a non-mold covered die or die stack side (2935). The above may all be implemented in strip form. Each of the flexible tape substrate units are singulated from the flexible tape substrate strip (2940). The end sections of flexible tape substrate units are folded up toward a mold covered die or die stack side and then folded again toward each other such that the end sections are somewhat parallel to the middle section (2945), i.e., the end sections are somewhat parallel to and overlay a mold covered die or die stack. The fact that the end sections are described as being somewhat parallel is not to be construed in a limiting manner as they may be disposed as desired.

Figure 30:
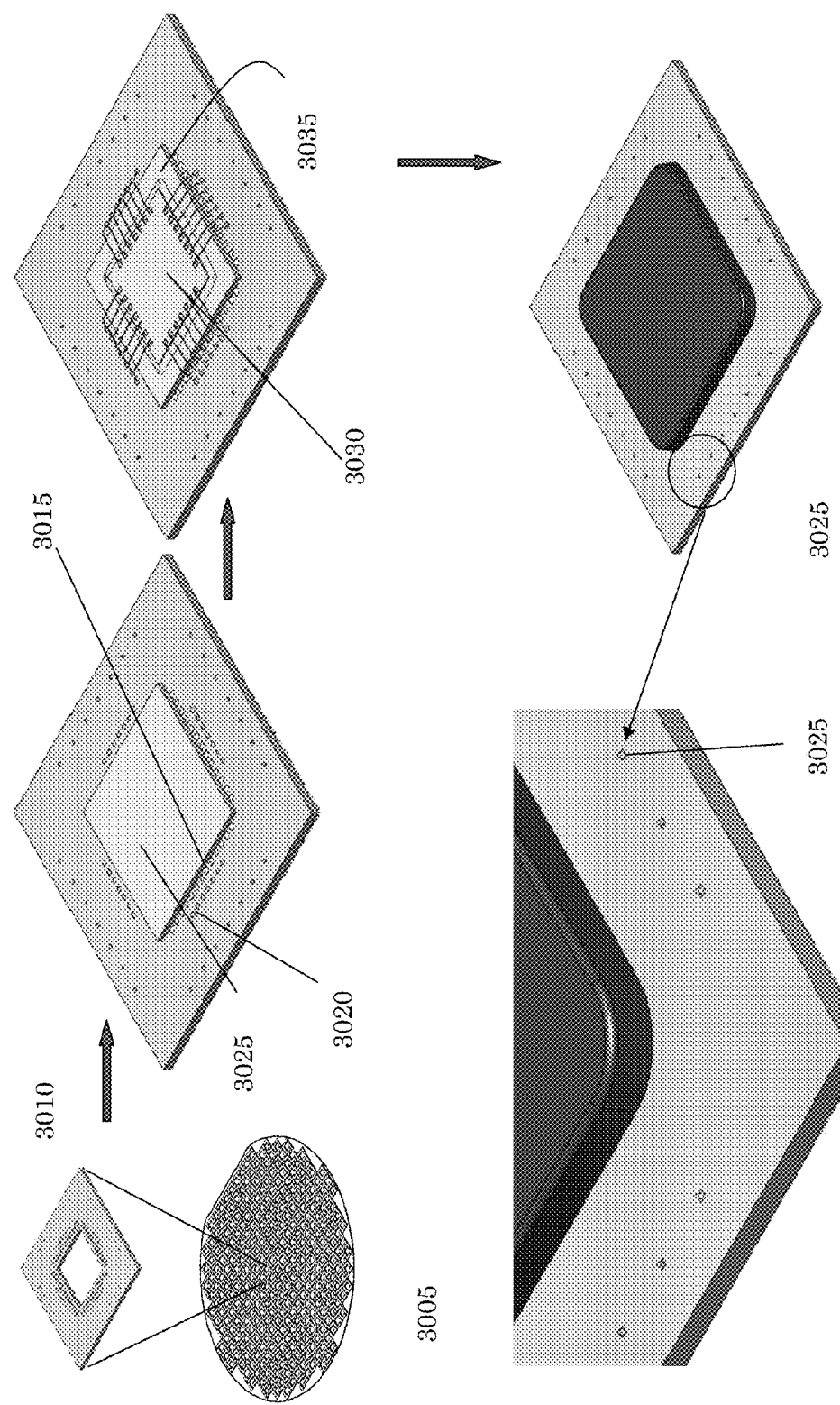
FIG. 30 is an embodiment and example front end process flow for a folded tape package.

FIGS. 30-44 show another embodiment and process flow for a folded tape package. FIG. 30 shows an overview of a front end process flow 3000 of the folded tape package. A silicon substrate or wafer 3005 may have multiple substrate dies 3010, where the wafer 3005 may be processed using techniques and processes known to those of skill in the art. Each substrate die 3005 may have flip-chip bonding pads 3015, wire bonding pads 3020 and stud bumps 3025. The silicon substrate or wafer may not have warpage issues such as those present for ceramic substrates, have better yield characteristics, and may be back-thinned to any thickness including being less than a ceramic or laminate substrate.

A functional die or chip, such as an imager die or chip 3025, may be flip-chip bonded to each substrate die 3010. A processor and/or memory chip or die 3030 may be attached to the imager chip 3025 and wire bonded to the substrate die 3010 to create a die stack 3035. The die stack 3035 may be covered with a mold 3040 using a transfer molding process. The processing described herein may be done at the wafer level to increase efficiencies and decrease costs. The attaching, bonding and transfer molding may use techniques and processes known to those of skill in the art.

Figure 31:
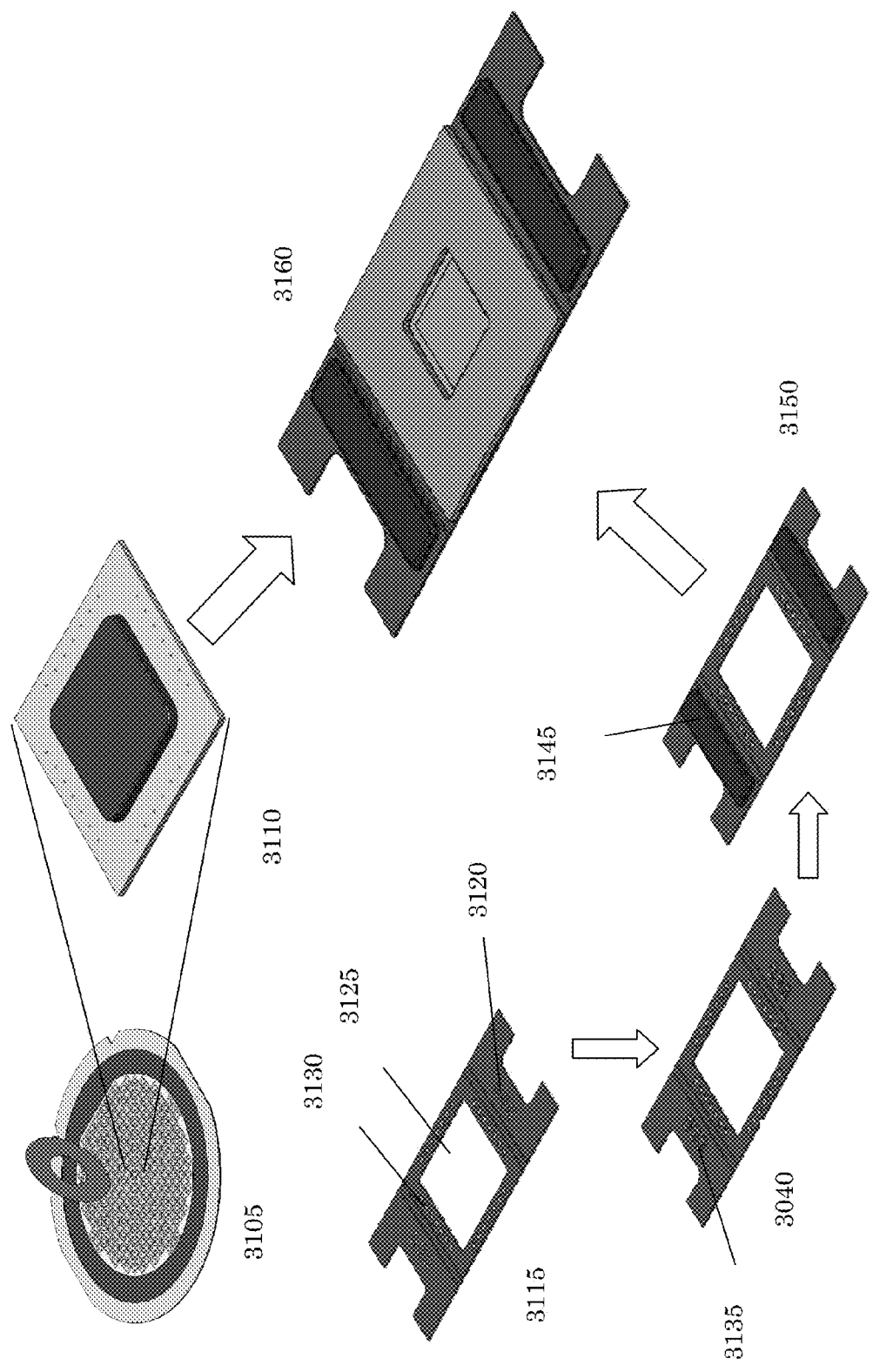
FIG. 31 is an embodiment and example back end process flow for a folded tape package.

FIG. 31 shows an overview of a back end process flow 3100 of the folded tape package. Each mold covered die 3110 may be separated from a wafer 3105 using techniques and processes known to those of skill in the art. For example, the wafer may be mounted and sawn to separate the die. A flexible tape substrate unit 3115 may be prepared as described herein to include SMT pads 3020, a window cavity 3125, and flip chip pads 3130. Passive components 3135 may be attached to the SMT pads 320 to form flexible tape substrate unit 3140. The surface mounted passive components may be covered by a mold 3045 using a transfer mold process to form flexible tape substrate unit 3150. The mold covered die 3110 may then be flip chip bonded to the flexible tape substrate unit 3150 to form flexible tape substrate unit 3160.

Figure 32:
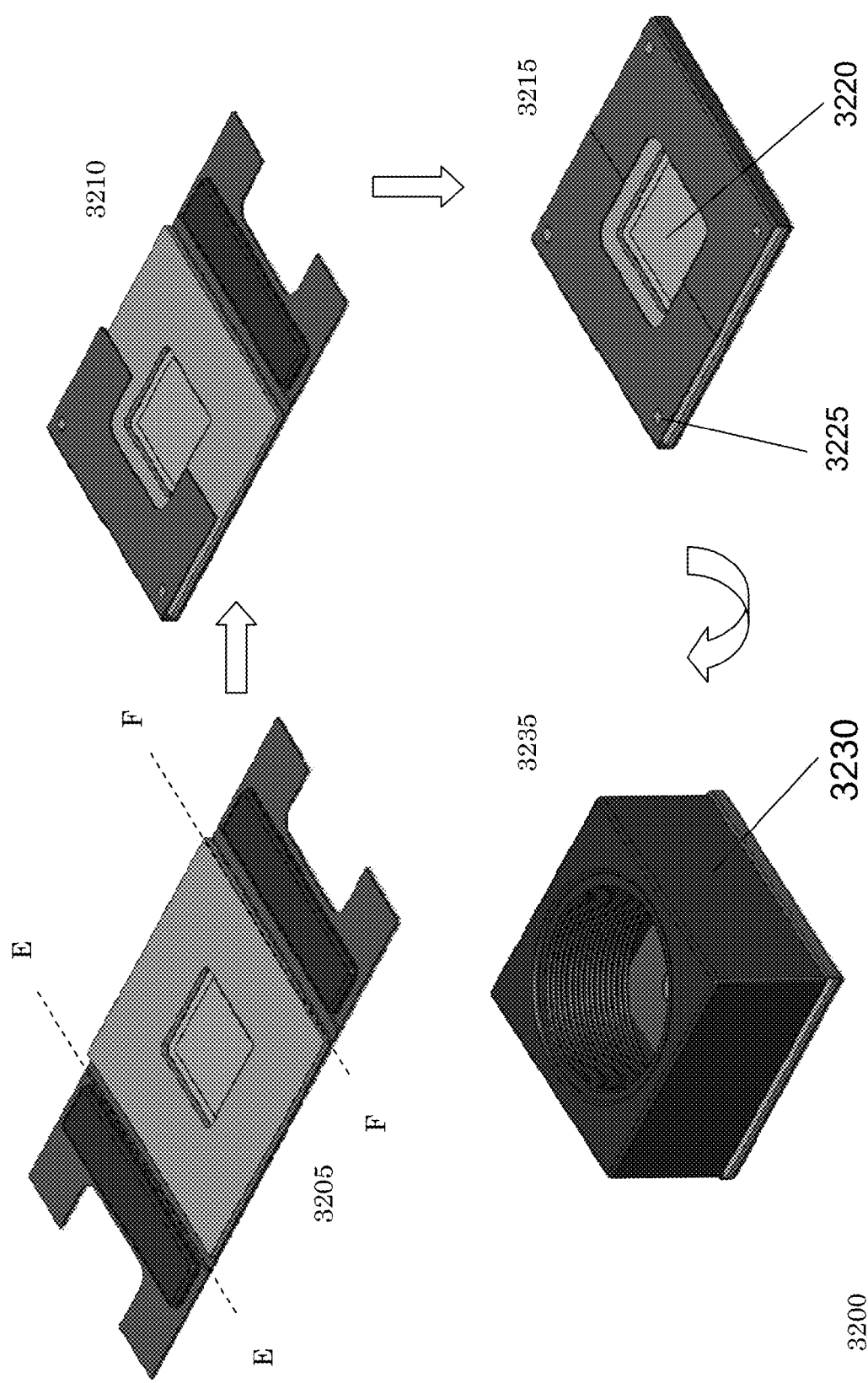
FIG. 32 is an embodiment and example tape folding process flow for a folded tape package.

FIG. 32 shows an overview of a tape folding process flow 3200 of the folded tape package. A flexible tape substrate unit 3205 may be folded along the dotted lines E-E to form flexible tape substrate unit 3210 and along dotted lines F-F to form flexible tape substrate unit 3215, i.e., the folded tape package. The folding process results in flexible tape substrate unit 3215 having an exposed section such that the imager chip 3220 may be exposed to external light and having multiple contact points 3225 for attaching another device, such as a housing 3230, by way of non-limiting example, to form a camera module 3235, by way of non-limiting example.

Figure 33:
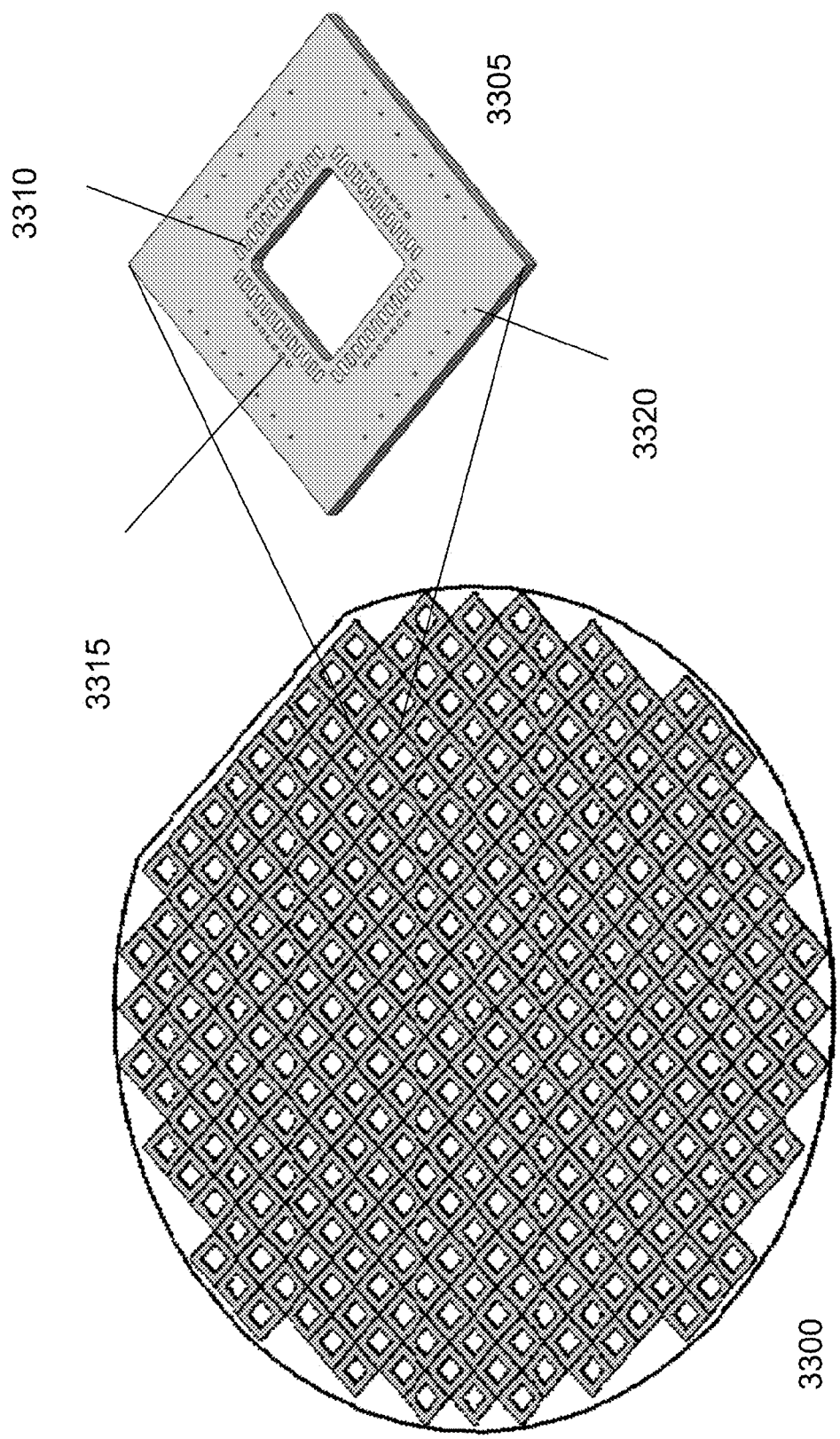
FIG. 33 is an embodiment of a silicon wafer substrate.

FIGS. 33-37 show an embodiment and process flow for processing a silicon wafer substrate for the folded tape package. FIG. 33 shows a silicon wafer substrate 3300, where each substrate die 3305 may include flip chip bonds 3310 for placement of a functional die, such as an imager die, by way of non-limiting example, and wire bond pads 3315 for attaching other functional dies, such as a memory and/or processor, by way of non-limiting example. The substrate dies 3305 may also include stud bump pads 3320 for attachment to the folding tape substrate. Gold sputter plated stud bumps may be applied on each substrate die 3305 using anistropic conductive paste (ACP) bonding process. The stud bump may be a single stud bump as opposed to double stud bumps, which may save cost on materials. In another embodiment, stud bumps may not be needed due to the flatness of the wafer and the flexible tape substrate and may reduce costs significantly. In addition, thermo-compression bonding force may be reduced because bonding on the silicon surface may require less force than the ceramic substrate and also due to the single bump geometry. More processing techniques may be used for flip chip bonding such as thermo-sonic bonding. This may occur additionally because of no coefficient of thermal expansion (CTE) mismatch between the dies and substrate. The lack of a mismatch may also increase reliability of the bonding processes. In another embodiment, the silicon substrate may include embedded passive components. This may save additional area.

Figure 36:
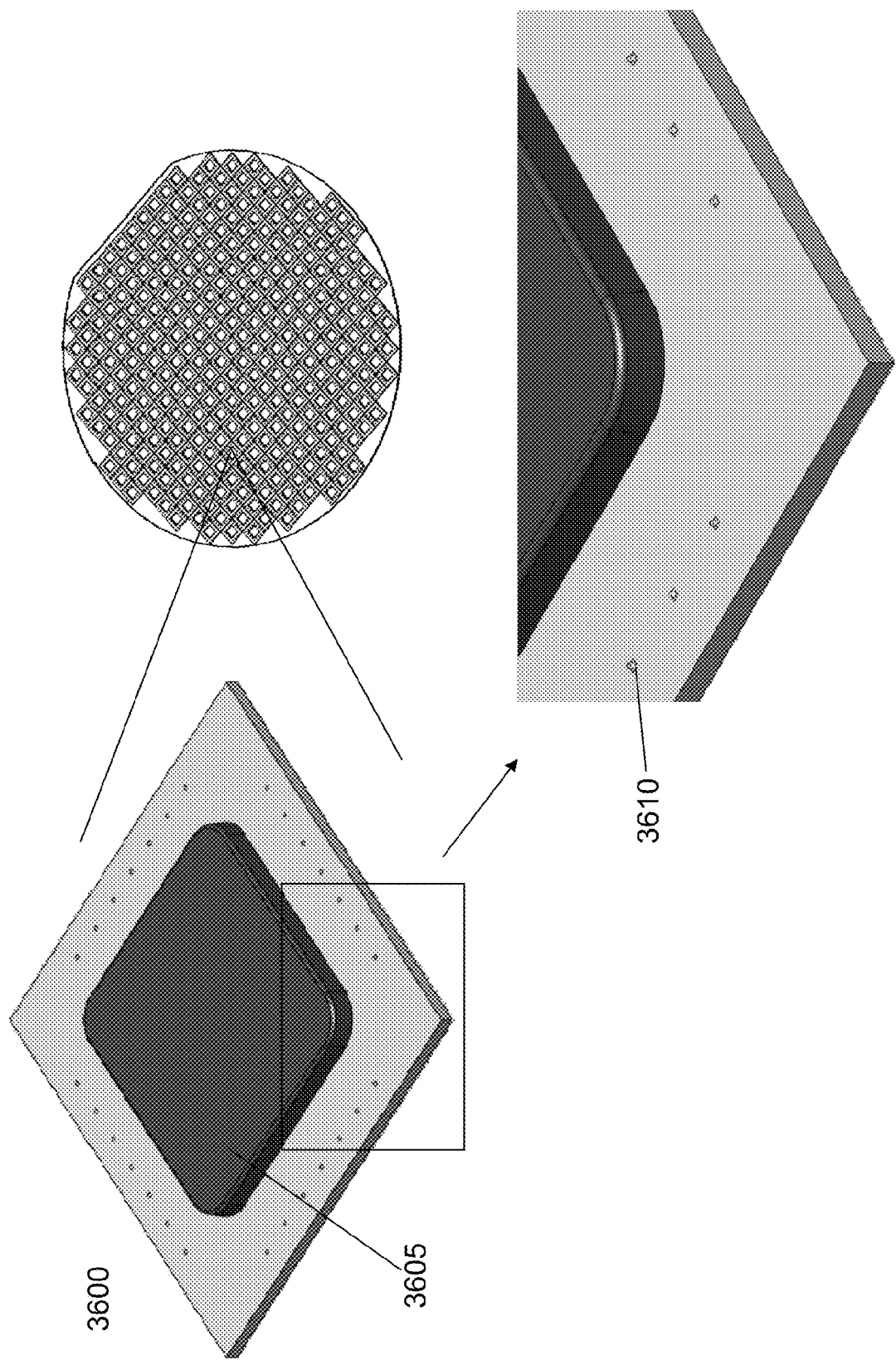
FIG. 36 is an embodiment and example process flow for encapsulation and stud bumping on a silicon wafer substrate.

FIG. 34 shows attachment of a functional die 3405, such as an imager die, to a silicon wafer substrate 3400 using flip chip bonding processes such as thermo-compression or thermo-sonic flip chip bonding, by way of non-limiting example. FIG. 35 shows attachment of a functional die 3505, such as a memory and/or processor die, to a first functional die 3510 and attachment of the functional die 3505 to a silicon wafer substrate 3500 using wire bonding 3515 to form a die stack. FIG. 36 shows the die stack of FIG. 35 (not visible) encapsulated with a mold 3605 to form an encapsulated die stack silicon wafer substrate 3600. As described herein, the mold 3605 may be implemented using mold transfer techniques and processes known to those of skill in the art. An exploded view of the studs 3610 as described herein is also shown in FIG. 36. All of the processes described herein above are implemented at a wafer level to increase efficiencies and decrease costs. For example, the units per hour may be significantly improved by processing an 8" wafer with more than 600 units at one time.

Figure 37:
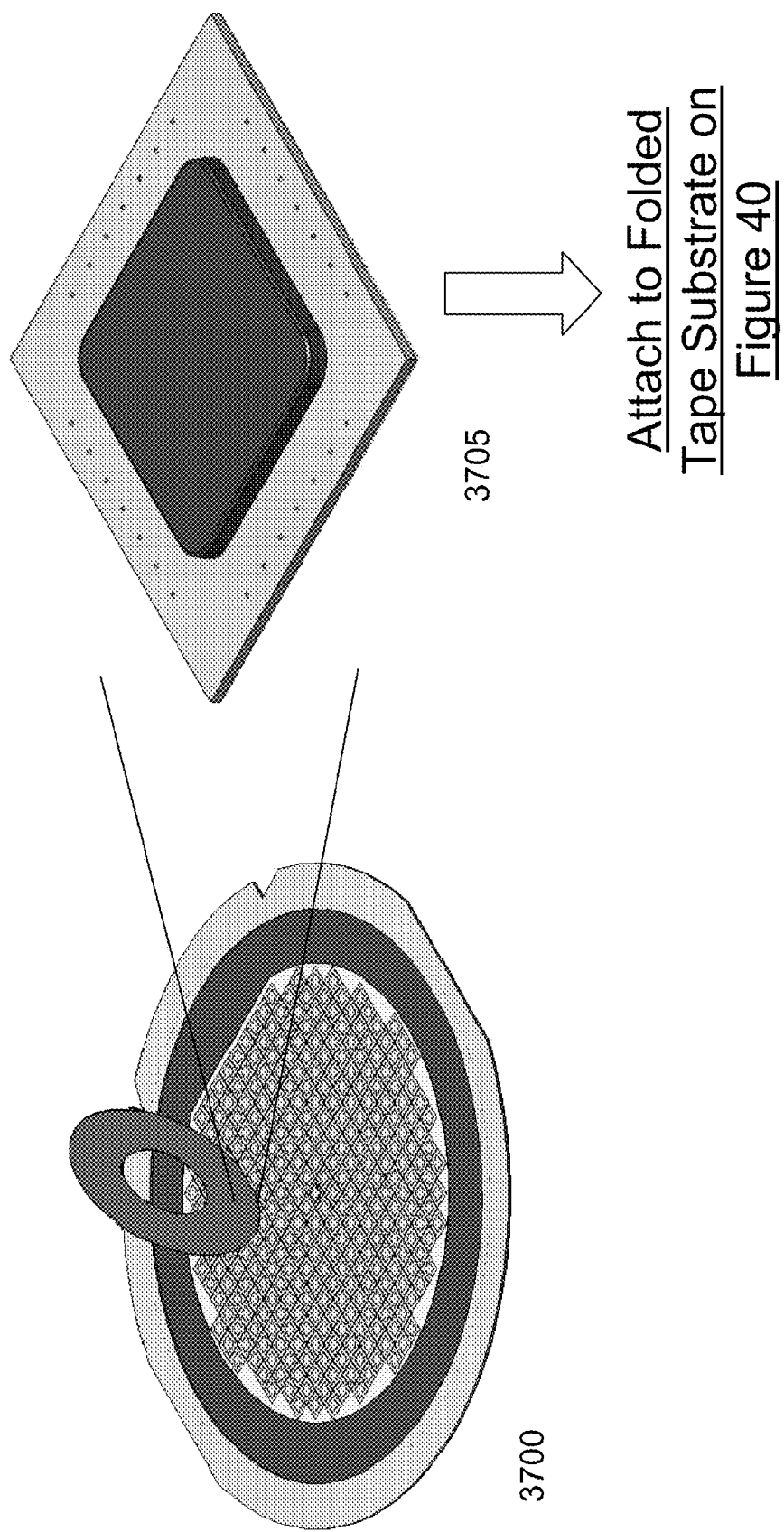
FIG. 37 is an embodiment and example process flow for dicing on a silicon wafer substrate.

FIG. 37 shows a silicon wafer substrate 3700 as processed herein above being mounted and diced into substrate dies 3705 using techniques and processes known to those of skill in the art. Dicing and sawing the silicon may result in less debris than ceramic scoring and snapping. This may lead to better particulate control. The separated substrate dies 3705 are then attached to a substrate flexible tape as described herein below.

Figure 38:
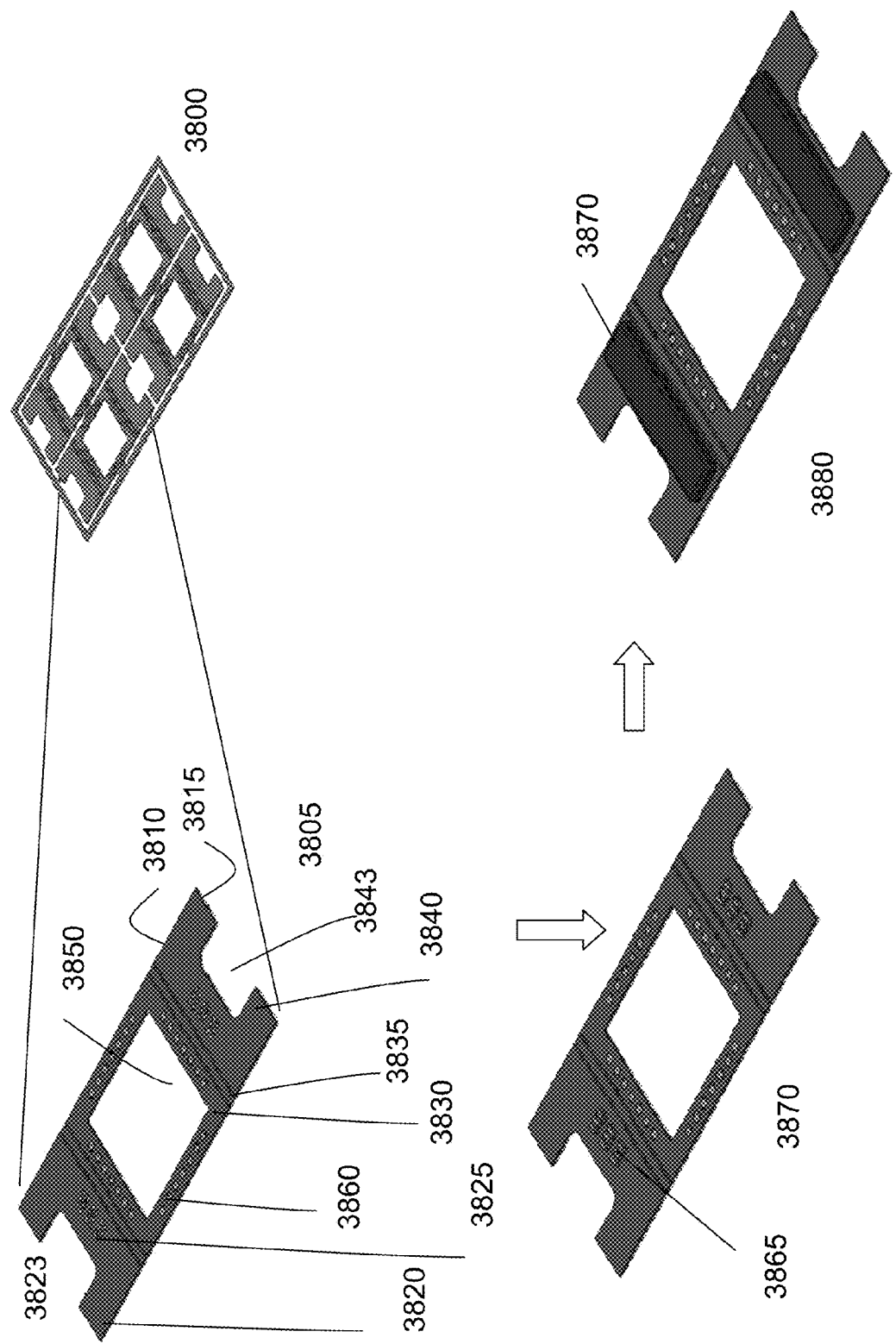
FIG. 38 is an embodiment and example process flow for surface mounting and transfer molding on a flexible tape substrate.

FIG. 38 shows an embodiment of a flexible tape substrate strip 3800 that may have multiple flexible tape substrate units 3805. Each flexible tape substrate unit 3805 may have a top surface 3810, (i.e., an image receiving side), and a bottom surface 3815, (i.e., a non-image receiving side). Each flexible tape substrate unit 3805 may further have a first end section 3820, a first fold section 3825, a middle section 3830, a second fold section 3835 and a second end section 3840. The first end section 3820 and the second end section 3840 on the top surface 3810 may have multiple surface mount (SMT) pads 3845 for passive components, by way of non-limiting example. The first end section 3820 and the second end section 3840 may further include a first notched section 3823 and a second notched section 3843. The middle section 3830 may have a window cavity 3850 for the dies, such as the separated substrate dies 3705 in FIG. 37, by way of non-limiting example. The window cavity 3850 may have associated flip chip pads 3860. The middle section 3850 may have on the bottom surface 3815 LGA pads (not shown). The first end section 3820 and the second end section 3840 on the bottom surface 3815 may have contact pads (not shown) for attachment of other devices, such as a housing, by way of non-limiting example. The flexible tape substrate and flexible tape substrate strip 3800 may be manufactured, implemented or constructed using techniques and processes known to those of skill in the art. As described herein, the flexible tape substrate may be a high density interconnect (HDI) flexible tape substrate.

Surface mounted passive components 3865 may be mounted on flexible tape substrate unit 3805 to form flexible tape substrate unit 3870. The placement of the surface mounted passive components 3865 may be accomplished using techniques and processes known to those of skill in the art. The surface mounted passive components 3865 may be encapsulated with a mold 3870 to form flexible tape substrate unit 3880. This may increase reliability and handling. The mold 3870 may be implemented using mold transfer techniques and processes known to those of skill in the art. The temperature may be raised on the molded side for better temperature balance during bonding. Bonding time may then be reduced, which may increase or improve the units per hour (i.e., production). The processing described herein for FIG. 38 may be done at the strip level to increase efficiencies and decrease costs.

Figure 39:
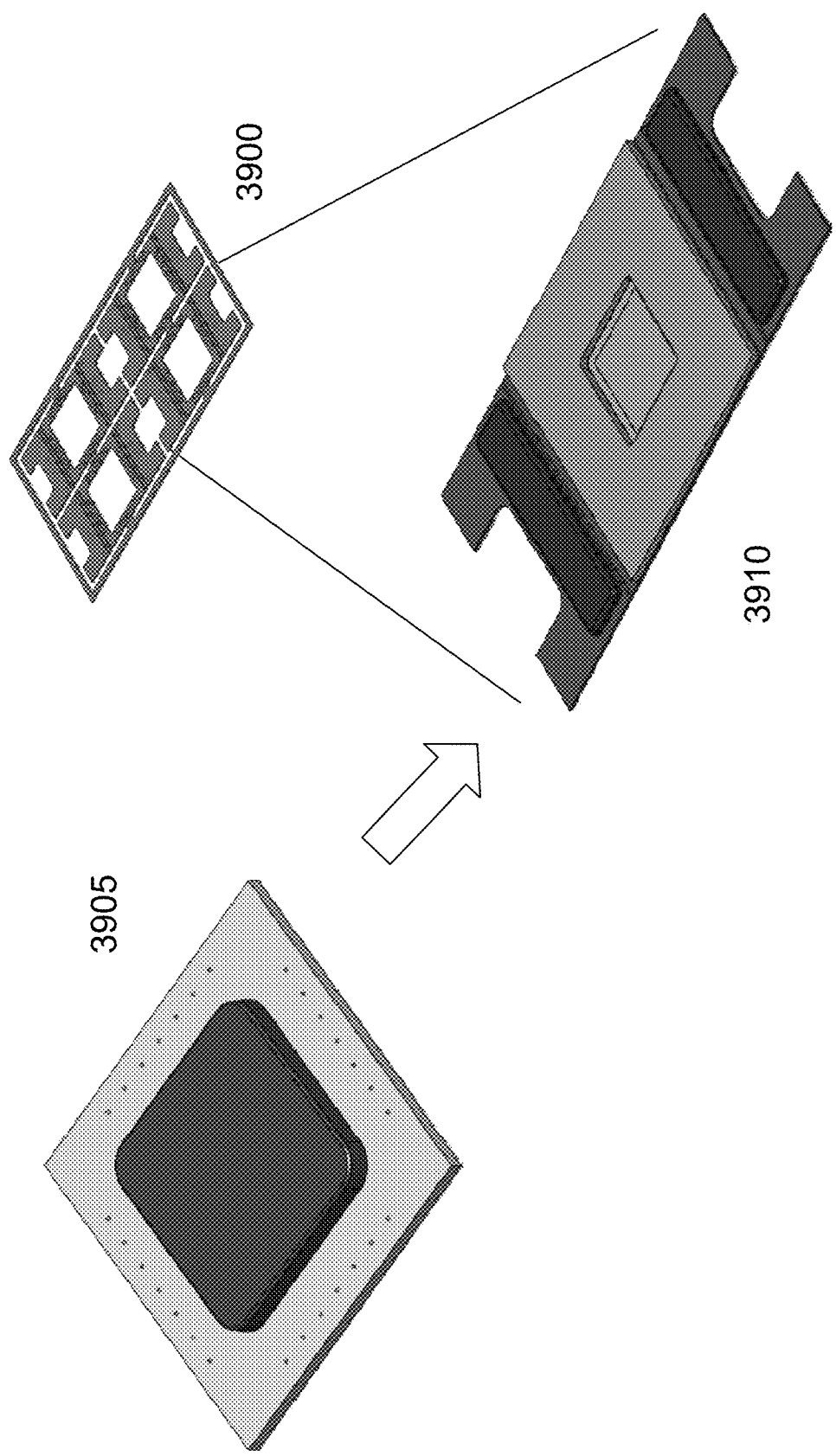
FIG. 39 is an embodiment and example process flow for bonding on a flexible tape substrate and package singulation.

FIG. 39 shows attachment of a processed substrate die 3905 to each processed flexible tape substrate unit in a flexible tape substrate strip 3900 using flip chip bonding processes or techniques as described herein. The attachment may be done at the strip level to increase efficiencies and decrease costs. Punch singulation may be used to separate a flexible tape substrate unit 3910 from the flexible tape substrate strip 3900. Punching may be done with the flexible tape substrate as opposed to a snapping or dicing process. Punching is a simpler mechanism and may be used due to the thickness of the flexible tape substrate and strip construction.

Figure 40:
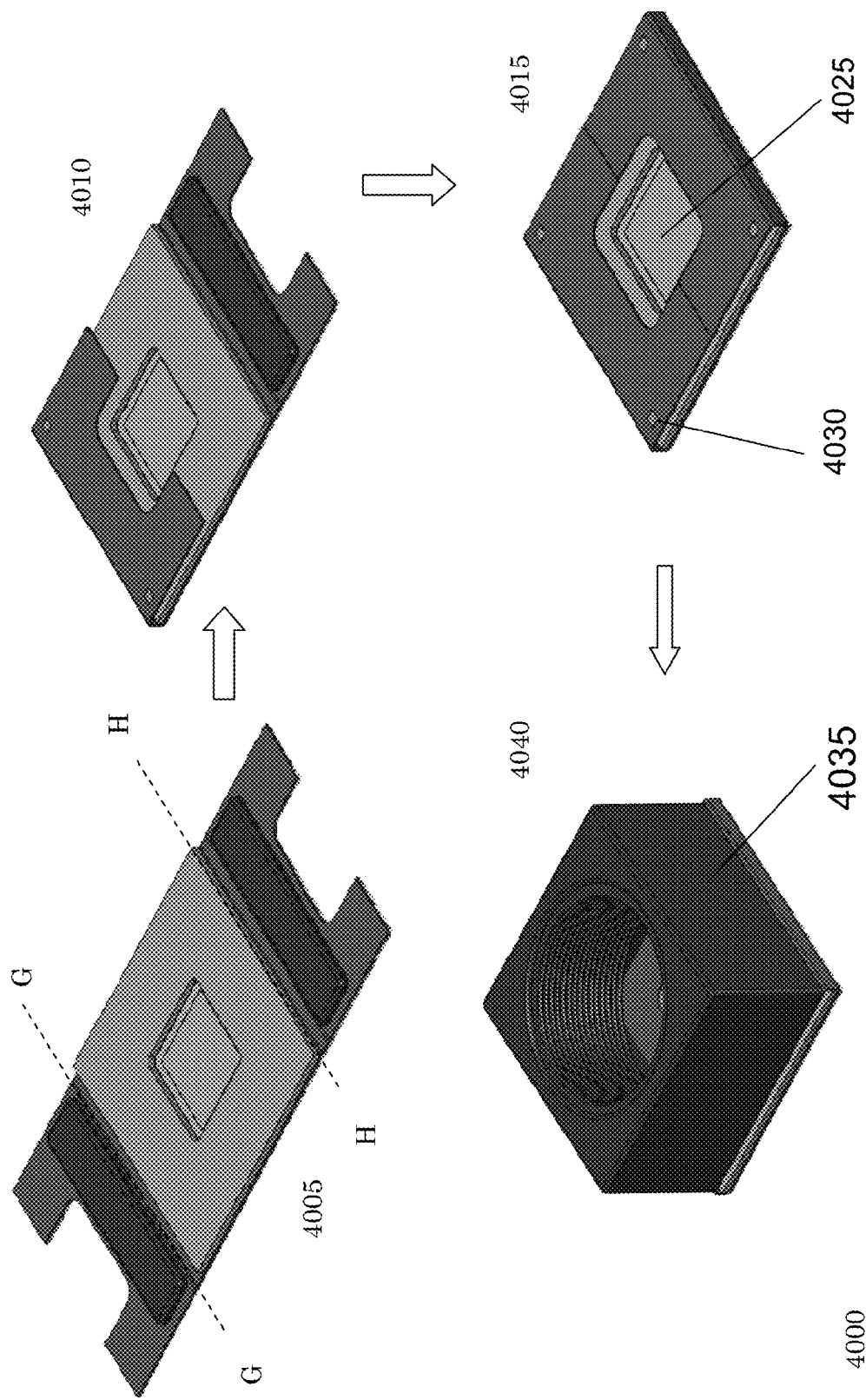
FIG. 40 is an embodiment and example process flow for folding the flexible tape substrate and attaching a housing to a folded tape substrate.

FIG. 40 shows a tape folding process flow 4000 of the folded tape package. A singulated flexible tape substrate unit 4005 may be folded along the dotted lines G-G to form flexible tape substrate unit 4010 and along dotted lines H-H to form flexible tape substrate unit 4015, i.e., the folded tape package. The folding process results in flexible tape substrate unit 4015 having an exposed section such that the imager chip 4025 may be exposed to external light and having multiple contact points 4030 for attaching another device, such as a housing 4035, by way of non-limiting example, to form a camera module 4040, by way of non-limiting example.

Figure 42:
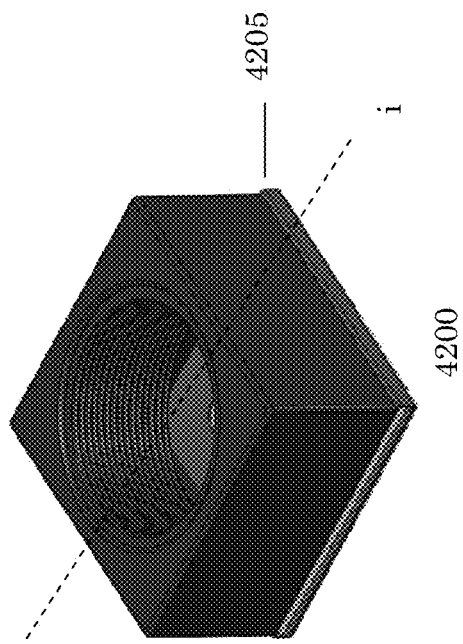
FIG. 42 is a reverse view of the embodiment of FIG. 41.
Figure 41:
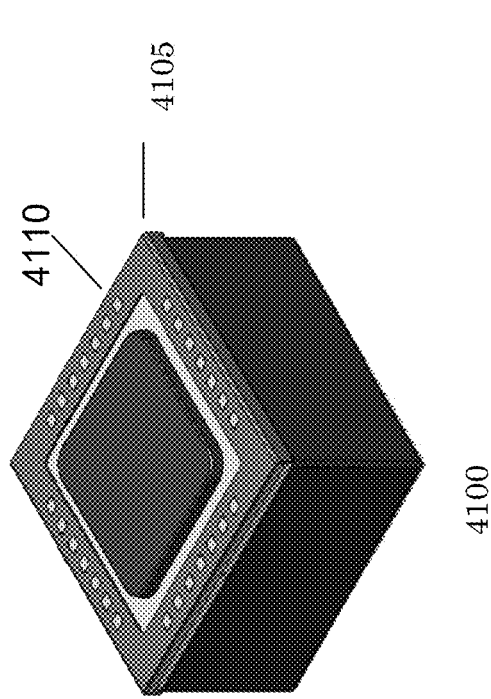
FIG. 41 is an embodiment of a folded tape package.
Figure 43:
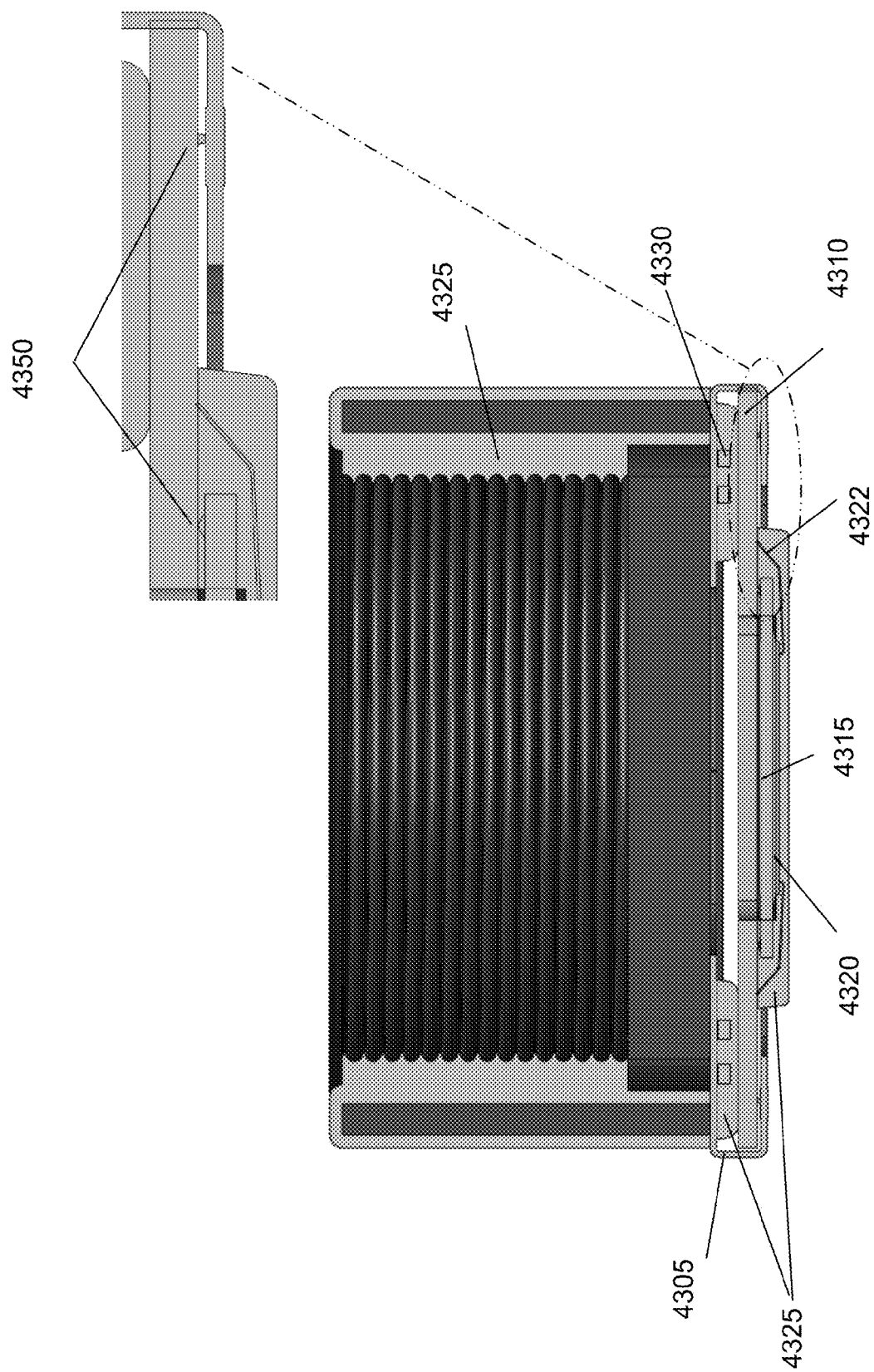
FIG. 43 is a cross-sectional view of the embodiment of FIG. 42.

FIG. 41 shows a non-image receiving side 4105 of a folded tape package 4100. The LGA pads 4110 as described herein may be seen. FIG. 42 shows an image receiving side 4205 of a folded tape package 4200. FIG. 43 shows a cross-sectional view of a folded tape package 4300 of the folded tape package 4200 along line I-I of FIG. 42. As shown, an image sensor or imaging chip 4315 is interconnected to a silicon substrate 4310, which is interconnected to a flexible tape substrate 4305 via gold stud bumps 4350. A processor and/or memory 4320 is interconnected to the image sensor 4315 and interconnect to the silicon substrate 4310 using gold wire 4322. A mold 4325 covers the image sensor or imaging chip 4315 together with the processor and/or memory 4320 (i.e., the die stack) and the passive components 4330. A housing 4335 is situated on the image receiving side of the flexible tape substrate 4305.

Figure 44:
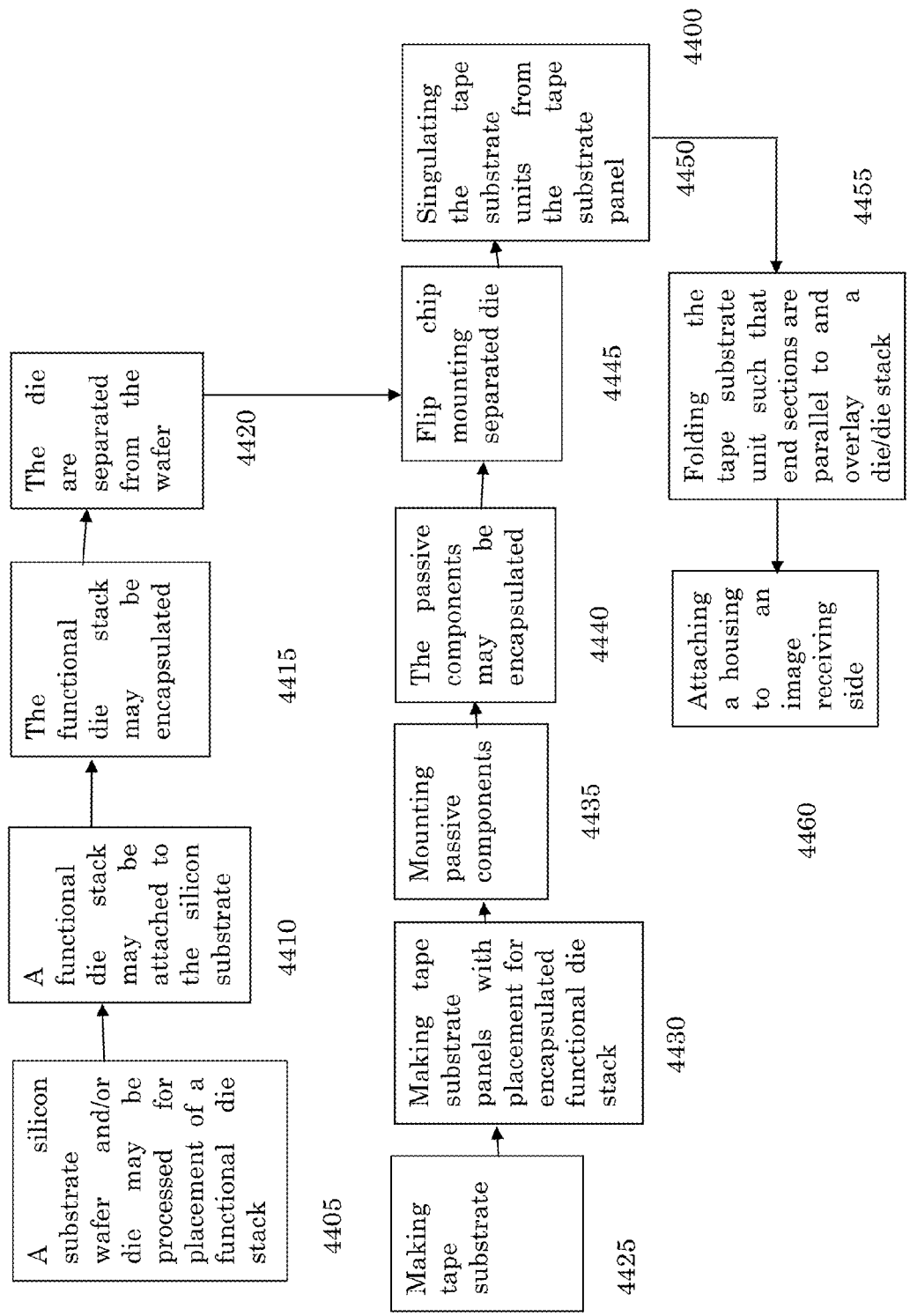
FIG. 44 is another example flowchart for manufacturing a folded tape package.

FIG. 44 is an example flowchart 4400 for manufacturing a folded tape package. For non-limiting purposes of further explanation, the folded tape package may be a camera module. A silicon substrate wafer and/or die may be processed to include flip chip bonding pads, wire bonding pads, stud bumps (if needed) and a window cavity for placement of a functional die stack (4405). A functional die stack may be attached to the silicon substrate (4410). The functional die stack may be encapsulated (4415). The die are separated from the wafer using know techniques (4420). A flexible tape substrate is made using techniques and processes known to those of skill in the art (4425). Flexible tape substrate strips are made where a middle section has a cavity for placement of a die and two end sections that have notches, SMT pads, and flip-chip bond pads on one side of the flexible tape substrate strip and contacts and LGA pads on another side of the flexible tape substrate strip (4430). Passive components are mounted on the SMT pads (4435) and encapsulated (4440). Encapsulated die may be flip chip mounted to flexible tape substrate units of the flexible tape substrate strip (4445). Each of the flexible tape substrate units are singulated from the flexible tape substrate strip (4450). The end sections of flexible tape substrate units are folded such that the end sections are somewhat parallel to the middle section (4455), i.e., the end sections are somewhat parallel to and overlay a mold covered die or die stack. A housing is attached to an image receiving side (4460).

As described herein, the methods described herein are not limited to any particular element(s) that perform(s) any particular function(s) and some steps of the methods presented need not necessarily occur in the order shown. For example, in some cases two or more method steps may occur in a different order or simultaneously. In addition, some steps of the described methods may be optional (even if not explicitly stated to be optional) and, therefore, may be omitted. These and other variations of the methods disclosed herein will be readily apparent, especially in view of the description of the folded tape package described herein, and are considered to be within the full scope of the invention.

Although features and elements are described above in particular combinations, each feature or element can be used alone without the other features and elements or in various combinations with or without other features and elements.

What is claimed is:

1. A camera module, comprising:
    a flexible tape substrate including two end sections and a middle section;
    the two end sections including surface mounted passive components on a top surface;
    the middle section including an imager die stack on the top surface, the imager die stack encapsulated in a mold with one side left exposed, wherein the two end sections are overlaid with the middle section in a folded configuration of the flexible tape substrate; and
    a housing attached to contact pads on a bottom surface in alignment with an image receiving side of the middle section, wherein at least the surface mounted passive components, the imager die stack encapsulated in a mold with one side left exposed and the housing are electrically connected through the flexible tape substrate through flip-chip connections.

2. The camera module of claim 1, wherein LGA pads and the mounting pads are on a same surface of each end section.

3. The camera module of claim 1, wherein one of LGA pads and mounting pads is on the top surface and the other of LGA pads and mounting pads is on the bottom surface of each end section.

4. The camera module of claim 1, further comprising:
    a stiffener attached to a mold covered imager die stack.

5. The camera module of claim 1, wherein the two end sections further include notched sections for overlaying the middle section and maintaining an exposed section in the middle section.

6. The camera module of claim 1, the mold covered imager die stack further comprising:
    a silicon substrate;
    an imager die attached to the silicon substrate; and
    at least one of a processor or memory attached to the silicon substrate and the imager die.

7. A folded tape package, comprising:
    a flexible tape substrate including two end sections and a middle section;

the two end sections including surface mounted passive components on a top surface;

the middle section including an imager die stack on the top surface, the imager die stack encapsulated in a mold with one side left exposed, wherein the two end sections are overlaid with the middle section in a folded configuration of the flexible tape substrate; and a housing attached to contact pads on a bottom surface in alignment with an image receiving side of the middle section, wherein at least the surface mounted passive components, the mold covered die stack encapsulated in a mold with one side left exposed and the housing are electrically connected through the flexible tape substrate through flip-chip connections.

8. The folded tape package of claim 7, wherein each end section further includes notched sections for overlaying the middle section and maintaining an exposed section in the middle section.

9. The folded tape package of claim 7, the mold covered die stack further comprising:

a silicon substrate;

a first functional die attached to the silicon substrate; and at least another functional die attached to the silicon substrate and the first functional die.

* * * * *